US008178775B2

(12) United States Patent
Taylor, II et al.

(10) Patent No.: US 8,178,775 B2
(45) Date of Patent: May 15, 2012

(54) METHODS, SYSTEMS, AND COMPUTER READABLE MEDIA FOR CONTROLLING ORIENTATION OF A PHOTOVOLTAIC COLLECTION SYSTEM TO TRACK APPARENT MOVEMENT OF THE SUN

(75) Inventors: Russell M. Taylor, II, Pittsboro, NC (US); Charles R. Evans, II, Chapel Hill, NC (US); John A. Crain, Durham, NC (US)

(73) Assignee: Megawatt Solar, Inc., Hillsborough, NC (US)

( * ) Notice: Subject to any disclaimer, the term of this patent is extended or adjusted under 35 U.S.C. 154(b) by 721 days.

(21) Appl. No.: 12/247,049

(22) Filed: Oct. 7, 2008

(65) Prior Publication Data

US 2009/0126774 A1 May 21, 2009

Related U.S. Application Data

(60) Provisional application No. 60/998,871, filed on Oct. 12, 2007.

(51) Int. Cl.
*H01L 31/042* (2006.01)
(52) U.S. Cl. .................................. 136/246; 250/203.4
(58) Field of Classification Search ............... 250/203.1, 250/203.4; 136/246
See application file for complete search history.

(56) References Cited

U.S. PATENT DOCUMENTS

| 257,560 | A | 5/1882 | Deitzler |
| 1,951,404 | A | 3/1934 | Goddard |
| 2,398,355 | A | 4/1946 | Bristol |
| 2,780,765 | A | 3/1954 | Chapin et al. |
| 2,914,657 | A | 11/1959 | Akely et al. |
| 2,919,298 | A | 12/1959 | Regnier et al. |

(Continued)

FOREIGN PATENT DOCUMENTS

JP  2002-094104  3/2002

(Continued)

OTHER PUBLICATIONS

Notification of Transmittal of the International Search Report and the Written Opinion of the International Searching Authority, or the Declaration for International Application No. PCT/US2008/006682 (Aug. 8, 2008).

(Continued)

*Primary Examiner* — Tony Ko
(74) *Attorney, Agent, or Firm* — Jenkins, Wilson, Taylor & Hunt, P.A.

(57) ABSTRACT

The subject matter described herein includes methods, systems, and computer readable media for controlling orientation of a photovoltaic collection system to track apparent movement of the sun. According to one aspect, a method for controlling orientation of a photovoltaic collection system to track apparent movement of the sun using a photovoltaic-collection-system-derived tracking algorithm is provided. The method includes determining an initial orientation of a photovoltaic collection system. The method further includes automatically deriving, using output from the photovoltaic collection system as it tracks apparent movement of the sun across the sky caused by spinning of the earth on its axis and its orbit around the sun, a tracking algorithm for controlling orientation of the photovoltaic collection system to track the apparent movement of the sun. The method further includes controlling orientation of the photovoltaic collection system to track apparent movement of the sun using the photovoltaic-collection-system-derived tracking algorithm.

19 Claims, 11 Drawing Sheets

U.S. PATENT DOCUMENTS

| | | | |
|---|---|---|---|
| 3,232,795 | A | 2/1966 | Gillette et al. |
| 3,868,823 | A | 3/1975 | Russell, Jr. et al. |
| 3,923,381 | A | 12/1975 | Winston |
| 3,972,600 | A | 8/1976 | Cobarg |
| 3,994,279 | A | 11/1976 | Barak |
| 4,071,017 | A | 1/1978 | Russell, Jr. et al. |
| 4,093,351 | A | 6/1978 | Perkins et al. |
| 4,103,672 | A | 8/1978 | Meyer |
| 4,106,484 | A | 8/1978 | Dame |
| 4,110,010 | A | 8/1978 | Hilton |
| 4,115,149 | A | 9/1978 | Bell |
| 4,119,365 | A | 10/1978 | Powell |
| 4,120,282 | A | 10/1978 | Espy |
| 4,149,521 | A | 4/1979 | Miller et al. |
| 4,158,356 | A | 6/1979 | Wininger |
| 4,173,397 | A | 11/1979 | Simpson |
| 4,205,659 | A | 6/1980 | Beam |
| 4,237,864 | A | 12/1980 | Kravitz |
| 4,243,301 | A | 1/1981 | Powell |
| 4,278,829 | A | 7/1981 | Powell |
| 4,318,394 | A | 3/1982 | Alexander |
| 4,339,627 | A | 7/1982 | Arnould |
| 4,376,580 | A | 3/1983 | Novak et al. |
| 4,388,481 | A | 6/1983 | Uroshevich |
| 4,445,030 | A * | 4/1984 | Carlton ............. 250/203.4 |
| 4,484,568 | A | 11/1984 | Witt |
| 4,571,812 | A | 2/1986 | Gee |
| 4,719,903 | A | 1/1988 | Powell |
| 4,734,557 | A | 3/1988 | Alfille et al. |
| 4,794,909 | A | 1/1989 | Eiden |
| 4,820,033 | A | 4/1989 | Sick |
| 4,888,063 | A | 12/1989 | Powell |
| 5,210,653 | A | 5/1993 | Schell |
| 5,269,728 | A | 12/1993 | Rogers et al. |
| 5,269,851 | A | 12/1993 | Horne |
| 5,325,844 | A | 7/1994 | Rogers et al. |
| 5,489,563 | A | 2/1996 | Brand et al. |
| 5,660,644 | A | 8/1997 | Clemens |
| 5,673,153 | A | 9/1997 | Soll et al. |
| 5,851,309 | A | 12/1998 | Kousa |
| 5,880,896 | A | 3/1999 | Ishii et al. |
| 6,035,850 | A | 3/2000 | Deidewig et al. |
| 6,464,363 | B1 | 10/2002 | Nishioka et al. |
| 6,662,801 | B2 * | 12/2003 | Hayden et al. ............. 126/571 |
| 6,818,818 | B2 | 11/2004 | Bareis |
| 6,886,339 | B2 | 5/2005 | Carroll et al. |
| 7,025,468 | B2 | 4/2006 | Nishioka et al. |
| 7,202,457 | B2 | 4/2007 | Janus et al. |
| 7,432,488 | B1 * | 10/2008 | Hines et al. ............. 250/203.4 |
| 7,875,796 | B2 | 1/2011 | Clemens et al. |
| 2004/0231715 | A1 | 11/2004 | Pagel |
| 2004/0261786 | A1 | 12/2004 | Kirk |
| 2005/0257827 | A1 | 11/2005 | Gaudiana et al. |
| 2006/0096586 | A1 | 5/2006 | Hayden |
| 2006/0274439 | A1 | 12/2006 | Gordon et al. |
| 2008/0023061 | A1 | 1/2008 | Clemens et al. |
| 2008/0314440 | A1 | 12/2008 | Clemens et al. |

FOREIGN PATENT DOCUMENTS

| | | |
|---|---|---|
| JP | 2003-240356 | 8/2003 |
| JP | 2005313586 | 11/2005 |
| JP | 2005344006 | 12/2005 |
| WO | WO 2005/066533 | 7/2005 |
| WO | WO 2007/052156 | 5/2007 |

OTHER PUBLICATIONS

Commonly-assigned, co-pending U.S. Appl. No. 12/127,468 for "Photovoltaic Collection Systems, Friction Drives, and Method for Tracking the Sun and Avoiding Wind Damage," (Unpublished, filed May 27, 2008).

Notification of Transmittal of the International Search Report and the Written Opinion of the International Searching Authority, or the Declaration for International Application No. PCT/US07/16972 (Feb. 26, 2008).

Notification of Transmittal of the International Search Report and the Written Opinion of the International Searching Authority, or the Declaration for International Application No. PCT/US2008/079097 (May 27, 2009).

Notice of Allowance and Fee(s) Due for U.S. Appl. No. 11/881,957 (Sep. 17, 2010).

Interview Summary for U.S. Appl. No. 11/881,957 (Jun. 1, 2010).

Official Action for U.S. Appl. No. 11/881,957 (Jan. 25, 2010).

Restriction/Election Requirement for U.S. Appl. No. 12/127,468 (Apr. 26, 2011).

"VRPN 07.26 Virtual Reality Peripheral Network," http://www.cs.unc.edu/Research/vrpn/index.html (Downloaded from the Internet on Jan. 15, 2010).

"Maximum Power Point Tracker (MPPT)—Data Sheet," Plan My Power, http://www.planmypower.co.za (Downloaded from the Internet on Jan. 15, 2010).

"RS485 Serial Information," Lammert Bies, http://www.lammertbies.nl/comm/infor/RS-485.html, (Copright 1997-2010) (Downloaded from the Internet on Jan. 15, 2010).

"Welcome to the OpenSSL Project," Sponsor OpenSSL, http://www.openssl.org/ (Copyright 1999-2009) (Downloaded from the Internet on Jan. 15, 2010).

Datasheets for RS-232 Bridge Controller Product, RS-232 Communication Converters, and RS-232 Battery Powered Converter CE-ETC, www.alldatasheet.com (Copyright 2003-2009) (Downloaded from the Internet on Jan. 15, 2010).

"23MDSI—Stepper Motors With Integrated Drivers and Controllers," Anaheim Automation (Copyright 2009) (Downloaded from the Internet on Jan. 15, 2010).

EDA Systems, http://www.ekasystems.com (Copyright 2009) (Downloaded from the Internet on Jan. 15, 2010).

Restriction and/or Election Requirement for U.S. Appl. No. 11/881,957 (Oct. 15, 2009).

"OpenSSH 5.3/5.3p1," http://www.openssh.com, (Oct. 1, 2009).

"TS-7250 Datasheet," Technologic Systems, www.embeddedARM.com (Copyright Jun. 2009) (Downloaded from the Internet on Jan. 15, 2010).

van Belle, et al., "The Scaling Relationship Between Telescope Cost and Aperture Size for Very Large Telescopes," Proc. SPIE, vol. 5489, No. 563 (Oct. 11, 2004).

"Dual Axis Inclinometer Sensor Component," Autonnic Components, pp. 1-3 (Nov. 2006).

Non-Final Official Action for U.S. Appl. No. 12/127,468 (Aug. 16, 2011).

* cited by examiner

METHODS, SYSTEMS, AND COMPUTER READABLE MEDIA FOR CONTROLLING ORIENTATION OF A PHOTOVOLTAIC COLLECTION SYSTEM TO TRACK APPARENT MOVEMENT OF THE SUN

RELATED APPLICATIONS

This application claims the benefit of U.S. Provisional Patent Application Ser. No. 60/998,871, filed Oct. 12, 2007; the disclosure of which is incorporated herein by reference in its entirety.

TECHNICAL FIELD

The subject matter described herein relates to photovoltaic collection systems. More particularly, the subject matter described herein relates to methods, systems, and computer readable media for controlling orientation of a photovoltaic collection system to track apparent movement of the sun.

BACKGROUND

A photovoltaic collection system is a system that includes one or more photovoltaic cells that generate electric current in response to incident light. Types of photovoltaic collection systems include direct, non-concentrating photovoltaic collection systems that receive incident light directly and generate current. Direct, non-concentrating photovoltaic collection systems typically include large arrays of photovoltaic cells, which may be expensive to manufacture and/or maintain. Another type of photovoltaic collection system is a reflective, concentrating photovoltaic collection system where incident light is reflected and concentrated onto an array of photovoltaic cells. Because the incident light is concentrated on the cells, a smaller array of cells can generate more output power than the same number of photovoltaic cells in a direct, non-concentrating photovoltaic collection system.

The efficiency of both direct and reflective photovoltaic collection systems can be improved by controlling the orientation of the photovoltaic cells and/or the reflectors with respect to the light source. For example, if the light source is the sun, it may be desirable to control the orientation of the photovoltaic collection system to track apparent movement of the sun as the earth spins on its axis and rotates around the sun. If time, position on earth, and orientation of the photovoltaic collection system with regard to the earth's spin axis are known, known ephemerides can be used to control orientation of the photovoltaic collection system in an open loop manner. One problem with such an approach is that one or more of these variables may not be known, making accurate tracking using ephemerides that are based on these variables difficult. Another problem with approaches that require all of these variables to be known is that the equipment or method for determining the variables may unnecessarily increase the cost of the photovoltaic collection system.

Accordingly, in light of these difficulties, there exists the need for methods, systems, and computer readable media for controlling orientation of a photovoltaic collection system to track apparent movement of the sun.

SUMMARY

The subject matter described herein includes methods, systems, and computer readable media for controlling orientation of a photovoltaic collection system to track apparent movement of the sun. According to one aspect, a method for controlling orientation of a photovoltaic collection system to track apparent movement of the sun using a photovoltaic-collection-system-derived tracking algorithm is provided. The method includes determining an initial orientation of a photovoltaic collection system. The method further includes automatically deriving, using output from the photovoltaic collection system as it tracks apparent movement of the sun across the sky caused by spinning of the earth on its axis and its orbit around the sun, a tracking algorithm for controlling orientation of the photovoltaic collection system to track the apparent movement of the sun. The method further includes controlling orientation of the photovoltaic collection system to track apparent movement of the sun using the photovoltaic collection system derived tracking algorithm.

According to another aspect, the subject matter described herein includes a system for controlling orientation of a photovoltaic collection system to track apparent movement of the sun using a photovoltaic-collection-system-derived tracking algorithm. The system includes a power unit including at least one photovoltaic array mounted on a pier. The system further includes a drive mechanism for controlling orientation of the power unit. The system includes a tracking module for automatically deriving, based on at least one signal output by at least a portion of the power unit, a tracking algorithm for controlling orientation of the power unit to track apparent movement of the sun across the sky caused by the spinning of the earth on its axis and its orbit around the sun. The tracking module controls the drive mechanism to vary orientation of the power unit to track the apparent movement of the sun using the photovoltaic-system-derived tracking algorithm.

According to another aspect of the subject matter described herein, a photovoltaic collection system is provided. The photovoltaic collection system includes a power unit having a photovoltaic array. A tilt sensor is coupled to the power unit for determining a tilt measurement for a tiltable portion of the power unit. A compass is coupled to the power unit for determining a compass reading from an azimuthally rotatable portion of the power unit. The system further includes a drive mechanism for moving at least a portion of the power unit. A tracking module uses the tilt measurement and the compass reading to determine an orientation of the power unit and controls the drive mechanism to vary the orientation of the power unit to track apparent movement of the sun across the sky caused by the spinning of the earth on its axis and its rotation about the sun.

The subject matter described herein can be implemented using a computer readable medium having stored thereon computer executable instructions that when executed by the processor of a computer perform steps. Exemplary computer readable media suitable for implementing the subject matter described herein include chip memory devices, disk memory devices, programmable logic devices, and application specific integrated circuits. In addition, a computer readable media that implements the subject matter described herein can be located on a single computing platform or may be distributed across multiple computing platforms.

According to another aspect, the subject matter described herein includes a computer readable medium having stored thereon computer executable instructions that when executed by the processor of a computer perform steps. The steps include determining an initial orientation of a photovoltaic collection system. The steps further include automatically deriving, using output from the photovoltaic collection system as it tracks apparent movement of the sun across the sky caused by the spinning of the earth on its axis and its orbit around the sun, a tracking algorithm for controlling orientation of the photovoltaic collection system to track the apparent movement of the sun. The steps further include controlling orientation of the photovoltaic collection system to track the apparent movement of the sun using the photovoltaic-collection-system-derived tracking algorithm.

BRIEF DESCRIPTION OF THE DRAWINGS

Preferred embodiments of the subject matter described herein will now be explained with reference to the accompanying drawings which.

DETAILED DESCRIPTION

Figure 1:
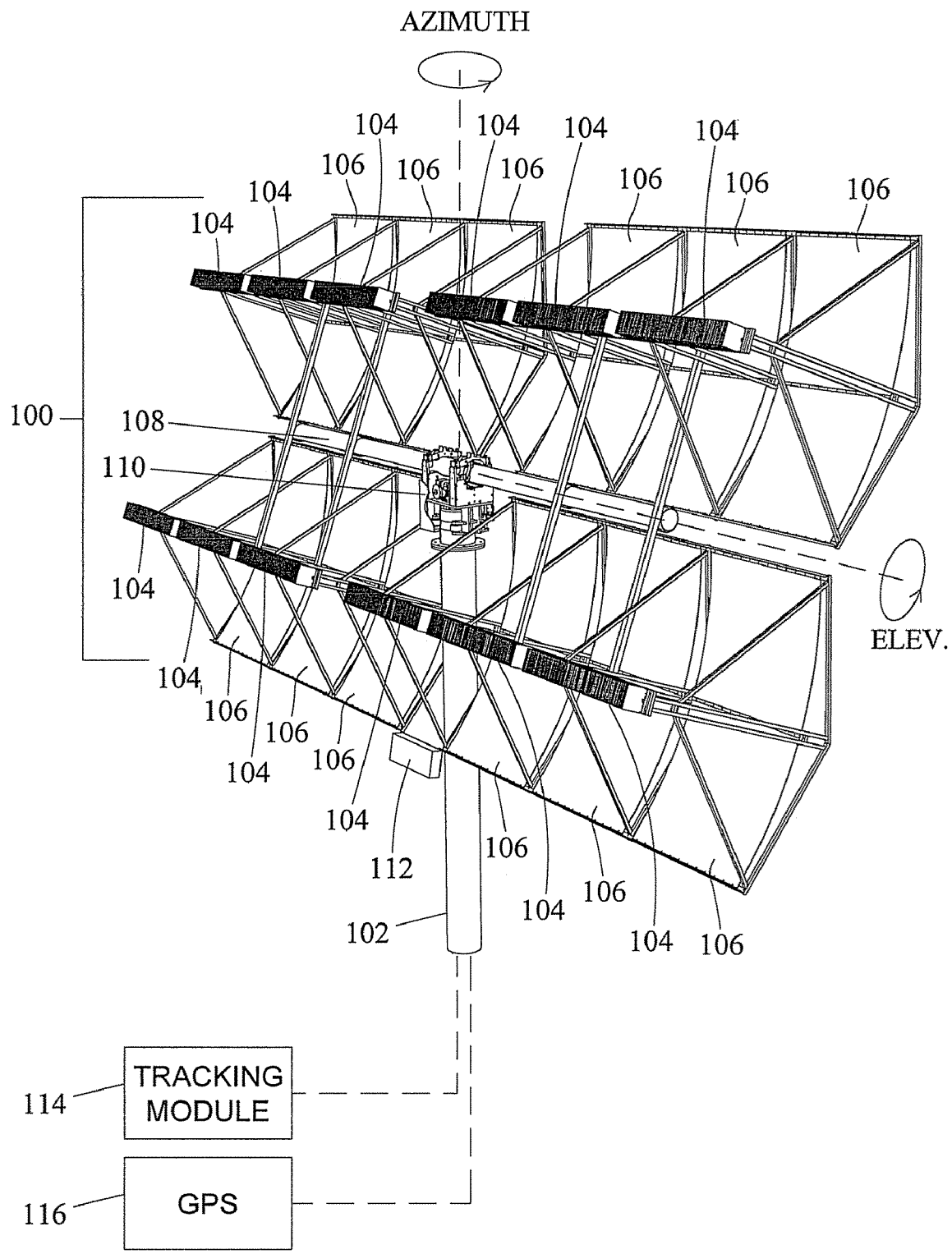
FIG. 1 is a perspective view of a photovoltaic collection system according to an embodiment of the subject matter described herein.

The subject matter described herein includes methods, systems, and computer readable media for controlling orientation of a photovoltaic collection system to track apparent movement of the sun. FIG. 1 is a perspective view of an exemplary photovoltaic collection system with which the subject matter described herein can be utilized. FIG. 1 illustrates a concentrating photovoltaic collection system where reflectors produce a concentrated, blurred image of the sun across linear photovoltaic arrays. However, tracking algorithms and the methods for deriving those algorithms described herein may also be used with non-concentrating, direct incident light photovoltaic collection systems. Referring to FIG. 1, the photovoltaic collection system includes a power unit 100 mounted on a support pier 102. Power unit 100 includes a plurality of photovoltaic collector arrays 104 and reflectors 106. Collector arrays 104 include solar cells that face the concave surface of each reflector 106. Reflectors 106 each comprise a sheet of light-reflective material that is bent into a shape that is a fraction of a sinusoid. Power unit 100 is mounted to a support beam 108, which in turn mounted to support pier 102 via drive mechanism 110. Drive mechanism 110 includes friction drives that separately control azimuth and elevation of power unit 100. As used herein, the terms "azimuth" and "elevation" refer to measurements that are in a coordinate system separate from a coordinate system of the tilt axis of the earth. Further details of power unit 100 are described commonly assigned co-pending patent application Ser. No. 11/881,957, filed on Jul. 27, 2007, the disclosure of which is incorporated herein by reference in its entirety.

Also illustrated in FIG. 1 is a compass and tilt sensor 112 that determines the amount of tilt of power unit 100 and a compass reading for power unit 100. As used herein, the terms "tilt" and "compass reading" refer to measurements in a coordinate system of the magnetic axis of the earth as measured by compass and tilt sensor 112. Compass and tilt sensor 112 may be an integrated unit as illustrated in FIG. 1. Alternatively, separately mounted compass and tilt sensors may be provided without departing from the scope of the subject matter described herein. In order to provide output that is useful in determining the orientation of power unit 100 when tracking the sun, the tilt sensor is preferably mounted to an elevationally rotatable or tiltable portion of power unit 100. In order for a compass to provide output that is useful for determining the orientation of power unit 100 when tracking the sun, the compass is preferably mounted to an azimuthally rotatable portion of power unit 100, and preferably not near any ferrous materials. In other embodiments, such as embodiments where azimuth and elevation are determined relative to pier 102 using encoders or sensors associated with the azimuth and tilt drive motors, compass and tilt sensor 112 may be eliminated.

Figure 2:
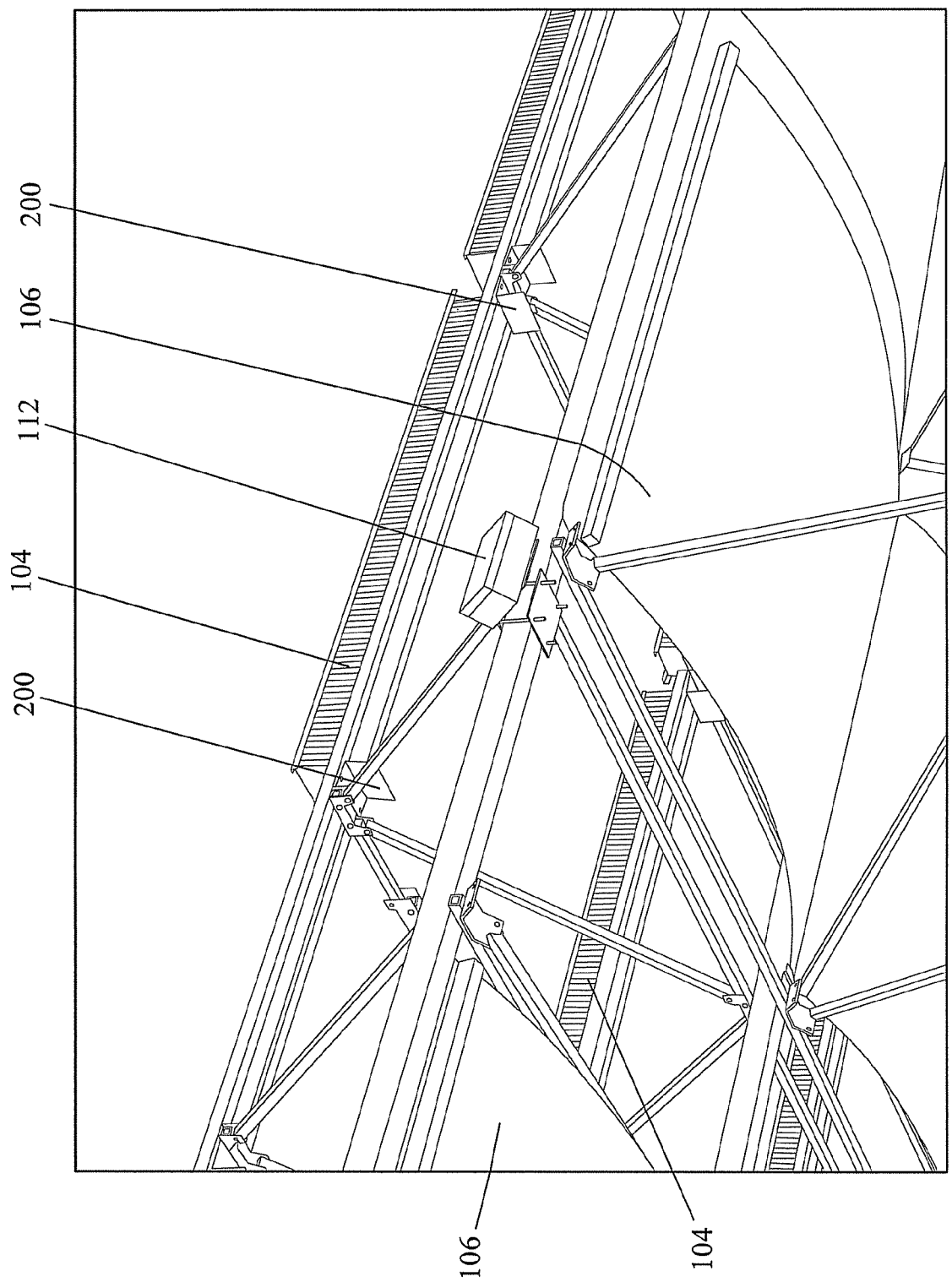
FIG. 2 is a perspective view of a photovoltaic collection system having a compass and tilt sensor for measuring orientation of the photovoltaic collection system according to an embodiment of the subject matter described herein.

FIG. 2 illustrates an exemplary location of compass and tilt sensor 112 on power unit 100 in more detail. Referring to FIG. 2, compass and tilt sensor 112 is mounted to an aluminum truss on the frame of power unit 100 in an area between adjacent reflectors 106. In the illustrated example, compass and tilt sensor 112 was mounted a 45-degree angle with respect to the horizontal orientation of power unit 100 and points away from the reflectors and collector arrays. However, this orientation is particular to the tilt sensor being used and the subject matter described herein is not limited to this orientation. Exemplary tilt sensors for which the orientation illustrated in FIG. 2 is appropriate include the AR45E and AR46ED dual axis inclinometer sensor components available from Autonnic Research Limited of Tollesbury, Essex, United Kingdom. The Autonnic tilt sensor measures plus or minus 45-degrees from its horizontal orientation. Accordingly, when power unit 100 is oriented horizontally or vertically, sensor 112 will be within its plus or minus 45-degree range. Other orientations of compass and tilt sensor 112 may be used, depending on the operating range of the sensor and as long as the orientation of the tilt sensor with respect to power unit 100 is known.

Returning to FIG. 1, according to another aspect of the subject matter described herein, a global positioning system (GPS) receiver 116 may be associated with power unit 100 to determine a global position, i.e., longitude and latitude of power unit 100. GPS receiver 116 may also be used to determine the current time, since signals from current GPS satellites include a time component. GPS receiver 116 may be useful when controlling orientation of power unit 100 based on an ephemeris that is not automatically derived from the output of power unit 100. In instances in which the ephemeris or tracking algorithm for power unit 100 is generated based on the output of power unit 100, GPS receiver 116 can be eliminated.

Automatically Derived Tracking Algorithm

According to one aspect, the subject matter described herein includes automatically deriving a tracking algorithm for controlling orientation of power unit 100 to track apparent movement of the sun across the sky as the earth spins on its axis and revolves about the sun. In this example, the automatically derived tracking algorithm is defined in a coordinate system local to support pier 102. Deriving the tracking algorithm involves determining an initial orientation of power unit 100 in the pier centric coordinate system, initial sun acquisition, and initial sun tracking, and recording the changes in azimuth and elevation of power unit 100 with respect to time during initial sun tracking. Once the changes have been recorded with respect to time, the next time that power unit 100 is operated, for example, on a subsequent day, it can be operated open loop using the self-derived tracking algorithm. Sensor or power feedback can be used as appropriate to correct any tracking errors.

Determination of Initial Orientation

The initial orientation of power unit 100 in a pier-centric coordinate system can be determined using any suitable sensor that is capable of sensing the orientation of power unit 100 with respect to pier 102. In one exemplary implementation, Hall effect sensors are used to determine the azimuth and elevation of power unit 100 as defined by the stepper motors used to control azimuth and elevation. Each motor rotates from a stop position that can be sensed by a sensor through an angle or arc that defines an azimuth or elevation measurement. In another example, mechanical or optical encoders can be used to determine the azimuth and elevation.

Equations of Motion for Tilted Axis Orbit

In deriving the tracking algorithm, it is assumed that the power unit 100 is mounted on a celestial object that is spinning about its axis and orbiting the sun. The axis may be tilted with respect to the sun. The derivation of the tracking algorithm described herein relies on the equations of motion for such an object (like the earth) to be stable over time; in particular, it is assumed that deviations are negligible over the 20-year life cycle of a solar generator and are much smaller than deviations caused by clock drift.

An analysis of the system's sensitivity to other effects reveals that compensation for the apparent elevation shift at low elevations caused by the atmosphere would need to be considered. However, when power unit 100 is operated only at above 15 degrees elevation, this should not be a concern. If the apparent elevation shift is a concern, it can be modeled based only on elevation. Alternatively, the derivation of the tracking model can avoid using measurements in that region to build the model and the tracking algorithm could constantly optimize at low elevations. Other effects are much smaller than a 0.5-degree elevational tolerance for which the tracking model is designed and need not be considered herein.

Clock

The clocks installed on personal computers are not intended to be precision timepieces. It is not unusual for PC clocks to gain or lose up to minutes per day compared to standard time. Manufacturer specifications allow for up to an hour per week of drift. This means that the clock associated with the controller of power unit 100 cannot be relied upon to have a correct rate of time passage. The rates on PC clocks are also reported to vary with time (perhaps due to temperature effects or variations in power level).

The two most common solutions to the clock drift problem each require additional hardware or system complexity. If a computer is connected to a network, time provided by the Network Time Protocol (www.ntp.org) can be used to ensure that the clock of the computer is consistent with the NTP time. This is often used in a hierarchy to reference time back to an atomic clock or some other standard time source. To function precisely, this approach requires a communication channel with low latency and low jitter. The shared-bus serial, mesh-connected EKA radio system proposed for power unit installations does not meet these criteria. It also ties the power unit reliability to the communications mesh reliability, something that may not be desirable in some installations.

The second solution is to install a time source with a direct communication path to each power unit 100. The most appropriate version of this for equipment that sits in locations with clear sky views is probably a GPS radio receiver. We could consider adding to system cost and complexity by including GPS receivers, but relying on GPS receivers will also increase the failure rate of the system. Accurate timing is not required for system functionality in a system that automatically derives its tracking algorithm based on power or sensor feedback. That is, it is not required in order for the tracking system according to the present subject matter to be synchronized with respect to some other time source. Embodiments of the present subject matter can function with a local time source as long as the time between measurable time increments is substantially uniform. Other embodiments of the present subject matter that operate on a time and location-based ephemeris may use a GPS receiver to obtain both time and location data usable for tracking the sun.

In any case, having an accurate clock does not provide the ability to know the sun's location without also knowing the position of the pier on earth and its orientation with respect to the earth's spin axis.

Rotation Speed of Earth

In systems that do not have a time source whose accuracy can be relied upon, knowledge about the exact rotational speed of the earth cannot be effectively utilized. For earthbound systems, we can certainly reject estimates of this speed that are off by more than a few percent of the expected value, but from the point of view of the computer (with its shifting clock) it will appear as if the sun is moving at an average rate that is slightly different from the actual rate and that this rate varies somewhat over time.

This requires the system to provide speed estimates based on its local clock that can vary somewhat over time, which indicates the use of a moving-average estimator of some sort. If the system is to work without modification on other celestial bodies orbiting stars, the check for the rotation speed being near earth-standard can be removed.

Orientation of the Support Pier

The orientation of the support pier with respect to the earth's spin axis (and one other specified coordinate direction, which could be the axis perpendicular to spin passing through Greenwich) must be known in order to determine the location of the sun. This orientation would have to be known to less than a half-degree tolerance in both directions for the embodiment described here and must not vary over the lifetime of the unit, if absolute location of the sun with regard to the earth's spin axis were used in the tracking algorithm.

Obtaining this information would require either careful placement of the support piers (increasing the labor cost of installation) or careful measurement (requiring either additional components in the system or additional labor cost of installation).

Figure 3:
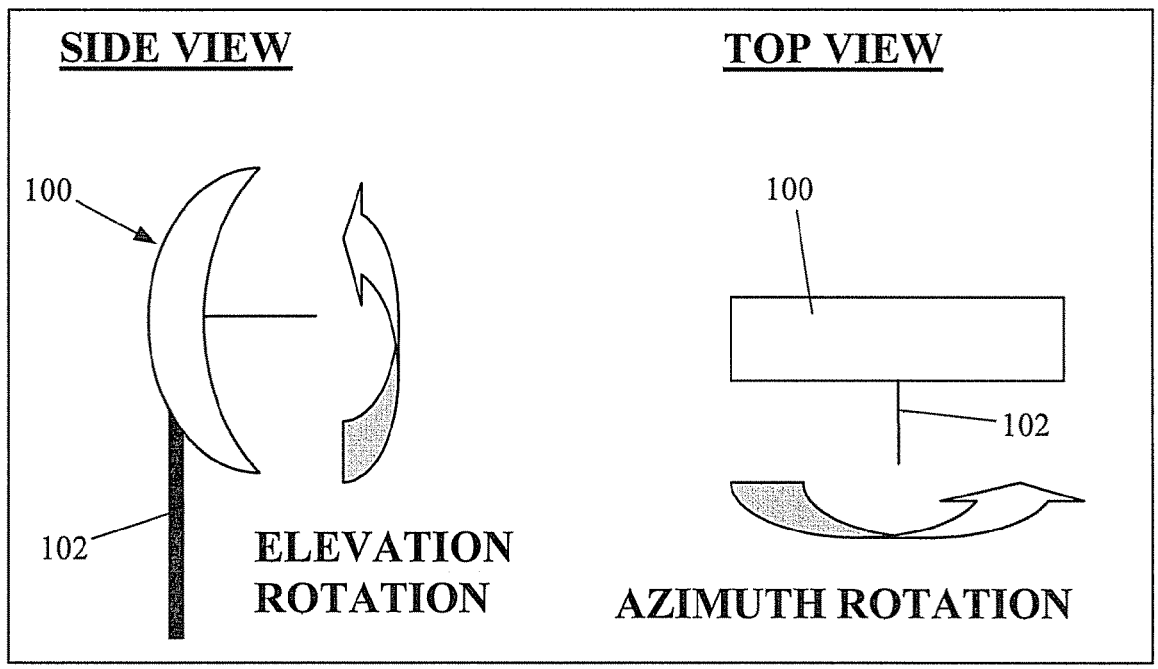
FIG. 3 is a schematic diagram illustrating azimuthal and elevational movement of a photovoltaic collection system according to an embodiment of the subject matter described herein.

The design presented in this section, which uses the above-mentioned self-derived tracking algorithm, does not rely on such information. That is, one implementation of the present subject matter does not require that the orientation of the support pier of the assembly with respect to the earth's spin axis be known. Instead, this implementation requires only that the orientation of the array be known in a coordinate system local to the array. More particularly, the implementation described in this section requires only that the azimuth and elevation of the array in coordinate system centered about the support pier be known. Azimuth refers to the angle swept by the array in a plane perpendicular to the pier. For example, when looking down on the array, if the array is rotated clockwise or counterclockwise about the support pier, the azimuth will change. Elevation refers to the tilting of the array about an axis orthogonal to the support pier. FIG. 3 illustrates a top view and a side view of a reflector of a power unit 100 and directions of elevational and azimuthal rotation. A local coordinate system for tracking and controlling movement of the array may be a three dimensional rectangular, polar, or spherical coordinate system centered at the support pier. For example, in a rectangular coordinate system, the z axis may be aligned with the support pier.

From the initial azimuth and elevation in the local coordinate system of the array, the present subject matter automatically develops a tracking algorithm for tracking the position of the sun. Because the tracking algorithm is automatically developed and does not require precise locating of the array with regard to the earth's spin axis, the tracking algorithm according the present subject matter allows arrays to be easily set up in any location and/or moved without requiring manual calibration by a skilled technician.

Figure 4:
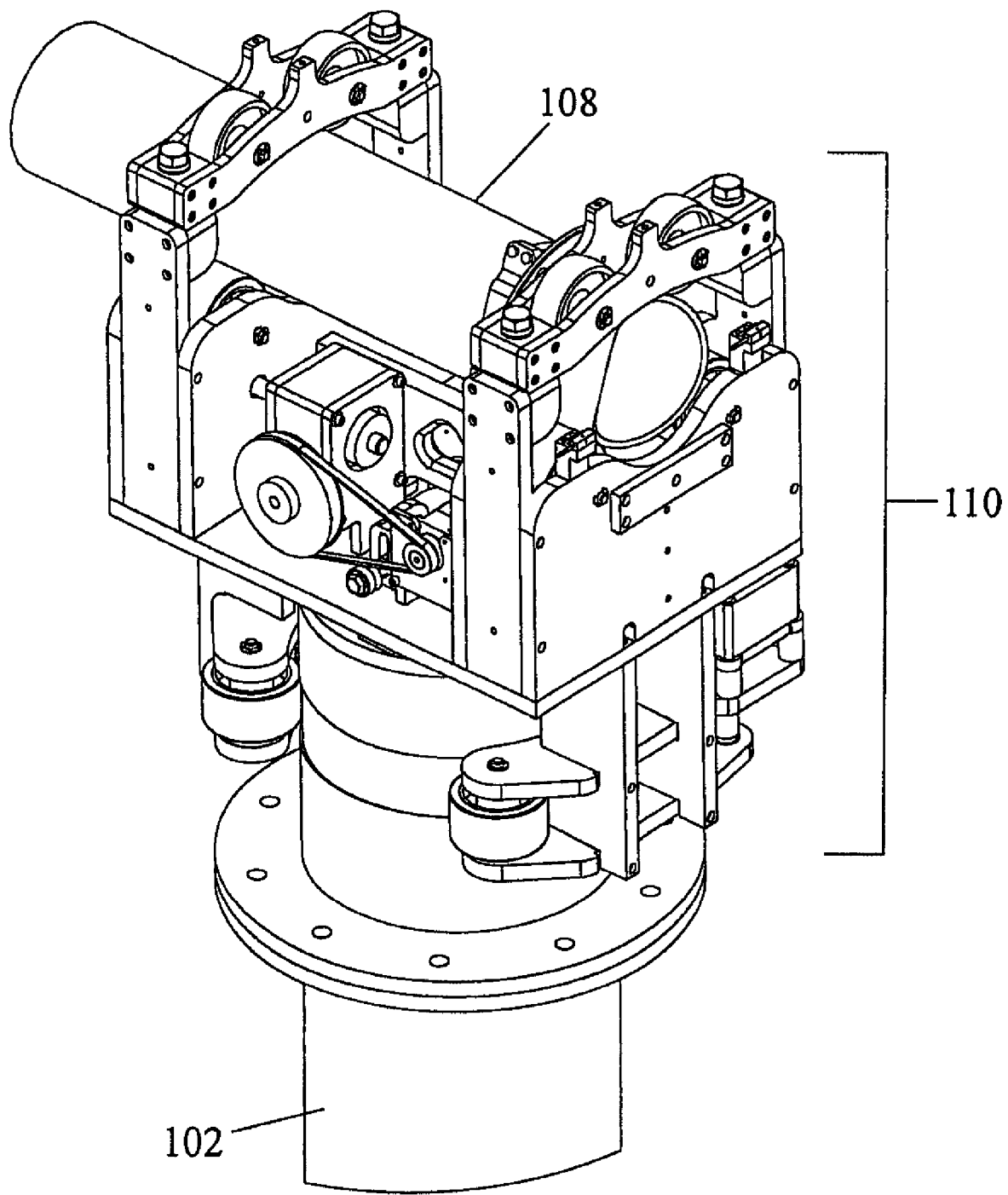
FIG. 4 is a perspective view of a drive mechanism for varying orientation of the power unit of a photovoltaic collection system according to an embodiment of the subject matter described herein.

The automatically derived tracking algorithm is used to control a drive mechanism including at least one motor coupled to the support pier and to a member orthogonal to the support pier. In one implementation, the drive mechanism is fixedly attached to power unit 100 and rotationally attached to the support pier via wheels so that the drive can rotate about the support pier to control azimuth of power unit 100. In this implementation, the drive mechanism is rotationally coupled to the orthogonal member so that the orthogonal member rotates within an aperture defined by the drive to control elevation of power unit 100. An exemplary drive mechanism suitable for use with the subject matter described herein is illustrated in U.S. patent application Ser. No. 12/127,468 filed on May 7, 2008, the disclosure of which is incorporated herein by reference in its entirety. FIG. 4 illustrates the drive, the support pier, and the orthogonal member. In FIG. 4, reference number 108 is the orthogonal member that is used to control elevation of power unit 100. Reference number 102 is the support pier that provides vertical support for power unit 100 and about which power unit 100 rotates to control azimuth of power unit. Reference number 110 is the drive mechanism, which effects movement of power unit 100 under control of the automatically derived tracking algorithm described herein.

Position on the Earth

When three of the following:
Time
Position on the earth
Pier orientation with respect the earth's spin axis and one other direction.
Direction of the sun in the pier-centered coordinate system are known, the fourth can be estimated.

In the present implementation that uses the auto-derived tracking algorithm, a precise estimate of the pier orientation is not required. In addition, without a network connection or GPS receiver, power unit 100 has no accurate time estimate, so could not determine any of the other three. It has no intrinsic need for an accurate time measurement (the system is a solar generator rather than a clock), so having an accurate estimate of the position of the tracker on the earth is of no benefit.

The position on the earth of each pier could be known to within sufficient tolerance by storing the location explicitly on each power unit or having it communicated by a cluster controller. However, knowing this without knowing the orientation of the support pier is not useful.

Design

Power unit 100 will operate most effectively when it has an estimate of the sun's location in its local pier-centered coordinate system that is accurate enough to let it to point its reflectors so that they reflect enough light onto its receivers to meet the power specifications of power unit 100. This requires the acquisition and maintenance of a sufficiently accurate local model of the sun's ephemeris.

Each power unit 100 will be capable of independently finding and tracking the sun using its instantaneous power output or other control feedback. In one implementation, each power unit 100 uses power output, i.e., the output of the array that would be fed to a power system in operation, rather than using a separate sensor to locate and track the sun. The use of power output as feedback for locating and tracking the sun eliminates the need for separate sensors to locate and track the sun. In an alternate implementation, each power unit 100 may use a measure of light incident on the collector arrays to track movement of the sun. Incident light may be measured using the same collectors that are used for power generation during operation of the power unit 100 or using separate sensors (perhaps also solar cells) mounted on each end of the collector assembly facing the same direction as the power generation solar cells. Separate solar cells on each end of the collectors can be used to produce a differential signal where the differential signal is the difference in voltage or power output by the separate solar cells mounted on opposite ends of the collectors. Assuming the image of the sun is somewhat symmetric, the sun can be located and tracked by determining and maintaining a differential signal that is zero or near zero. The procedures described herein for model generation and tracking apply (except as indicated below) both to the case where separate sensors or collectors are used and where the power generation collectors are use for sun image acquisition and tracking.

Onboard power unit control software design is divided into intercommunicating processes that manage control of each power unit 100 at two levels of abstraction. The control process constitutes the lowest level and is responsible for direct communication with the motors and power control and measurement unit. The control process is responsible for moving the unit to set points and for executing dedicated modes of operation such as stowing.

A higher-level tracker process (identified as tracking module 114 in FIG. 1) will locate the sun, build a model of the sun's motion, and maintain the position of the assembly to within the input tolerance of the optics (as described in the next section). The tracker process will communicate to the control thread via an IP connection using the public domain VRPN communication protocol (www.vrpn.org) or another protocol.

Power Unit Cold Boot Procedure

This section describes the procedure that each power unit 100 will use for initial set-up and also to recover from complete power loss, where even the system's Basic Input Output System (BIOS) has failed and it has no record of its location or the time. This procedure could also be used when a power unit 100 fails to locate the sun at a time when other inputs indicate that the sun is up (based on either external sun sensors or reports from other power units within a cluster).

Locking onto the Sun

In a system that has absolute encoders to determine its orientation, the limit and hysteresis measurement described below is not required. For example, absolute mechanical, electrical, or optical encoders could be positioned on each power unit 100 to sense the power unit's absolute elevation and azimuth in its pier centered coordinate system when each power unit 100 is powered on. In the alternative, as will be described in detail below, it may be desirable for cost and purposes to omit absolute encoders and instead use a procedure to determine the absolute elevation and azimuth of the system in its pier centered coordinate system. An exemplary procedure for determining azimuth and elevation of a power unit will now be described.

Verify Motions, Limits, and Hysteresis Procedure

Upon cold boot, the system will initially determine its absolute position in azimuth and elevation using homing routines that rely on triggering of sensors when the unit reaches the end of the range of travel along each axis. If motions have been commanded that would have rotated by twice the available range for the unit without reaching the sensors, the system enters a failure state.

A hysteresis estimation procedure will be run that moves away from the home location until the sensor disengages; the distance traveled before this happens corresponds to one motion tick longer than the hysteresis in the '+' direction. The motor will then travel back towards the stop until the sensor is triggered; the distance traveled before this happens corresponds to one tick less than the hysteresis in the '−' direction. If needed, the hysteresis estimation can be repeated multiple times and can be performed at each end of travel to produce more reliable estimates.

The voltage generated by the unit when it is in daylight, even in the standby orientation, should be distinguishable from the (minimal) power generated at night. If this is not true, then a secondary assumption that an external computer (or a coarse local time measurement) is always able to determine the local time will enable the following procedure to continue. Failing that, the unit can run its initial sun acquisition process every four hours until the sun has been located.

When a cold-booted power unit is requested to begin energy collection, it will run its initial sun acquisition procedure followed by its initial sun-tracking procedure. If the initial sun acquisition procedure fails, it will wait until it is not dark and then repeat the acquisition routine at intervals of 30 minutes until it acquires lock on the sun or it gets dark again.

Initial Sun Acquisition Procedure

Assumption: The cylindrical parabolic dishes have a vertical axis of symmetry in the version of the power unit for which this was generated. If they do not, switch azimuth and elevation in many of the following sections and adjust the algorithm as needed.

When commanded to do initial sun acquisition, a power unit 100 will move to the center of its range in azimuth and elevation and then scan the sky using a linear Lissajous pattern that has relatively prime periods in azimuth and elevation such that it covers the entire sky with 4-degree coverage in azimuth (or with sufficient coverage to ensure detection of the sun). (A faster method is available if multiple power units are controlled consistently. Multiple power units could be used, each starting at a uniformly- or randomly spaced location along the Lissajous pattern.) It will scan at its maximum rate of motion, sampling the amount of power being generated at a rate sufficient to detect a peak at the maximum motor speed. If the unit ever reaches a specified fraction (perhaps $1/10^{th}$) of the maximum expected power, it will immediately switch to the initial sun-tracking procedure. If not, then the system reports a failure to find the sun and returns to its stow position.

Other acquisition procedures are possible, such as random sky searches or localized searches based on partial knowledge of time and/or orientation.

Initial Sun Tracking Procedure

This mode will be entered when a power unit 100 reaches the specified fraction (perhaps $1/10^{th}$) of the maximum expected power (nearly pointed at the sun). This mode keeps the tracker centered on the maximum-power direction over time. The algorithm is designed to operate properly in the presence of variable cloud cover. It does not rely on an estimate of where the sun should be located for a particular time and location (time and location have not yet been determined by the power unit).

Figure 5:
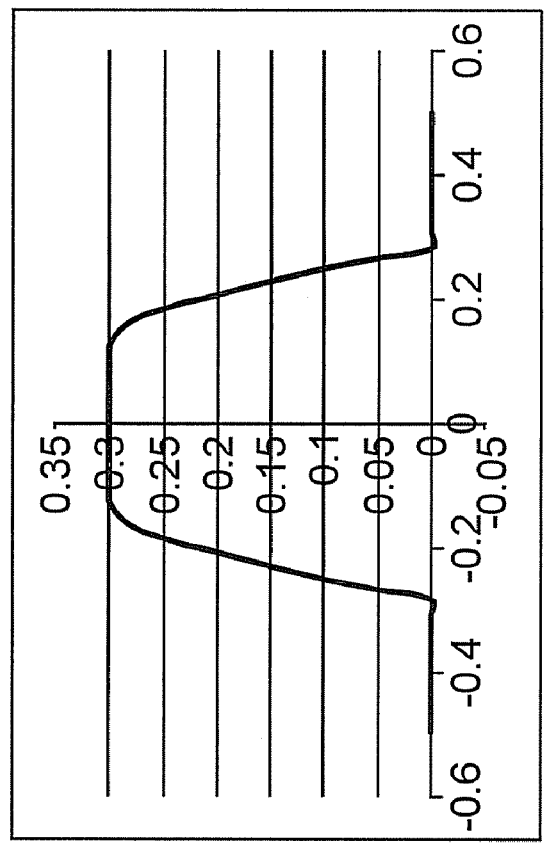
FIG. 5 illustrates graphs of signals to which an initial sun tracking procedure according to an embodiment of the subject matter described herein can be applied.
Figure 5:
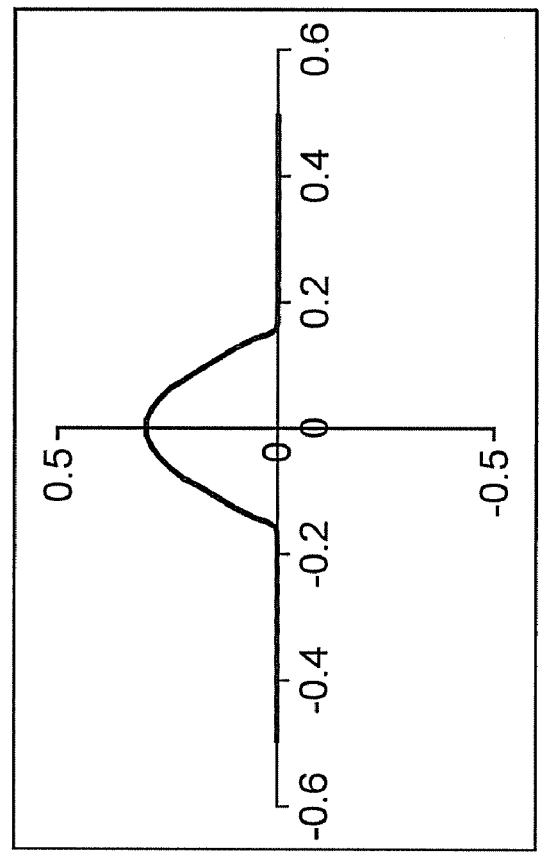

Assumption: There will be sufficient power reduction along the axis of symmetry on the graph of output power versus time to determine the sun location to within $1/8^{th}$ degree. If this is not the case, then (1) the magnitude of the search will be larger along this axis, (2) the frequency of the search will be lower, and (3) a scan-and-fit-function approach will be taken instead of a local maximum estimation. The graph on the left hand side of FIG. 5 shows an example of sufficient power reduction, whereas the graph on the right hand side of FIG. 5 shows a signal that is flat on the top and which will require a scan-and-fit approach.

The algorithm proceeds serially on the two axes (azimuth and elevation), optimizing first one and then the other. The optimization procedure for one axis consists of reading the current position, $1/8^{th}$ degree lower, and $1/8^{th}$ degree higher (or some other appropriate fraction of a degree). The motors are driven to point power unit 100 in these directions and the power output at each is sampled. The maximum position is recorded. (To account for cloud-induced variation, this may be done multiple times. If the same location is the maximum for a majority of trials, it is assumed that the measurement is reliable and has not been corrupted by cloud-cover variation. Continuous cycling continues until three in a row agree or ten minutes has passed. After ten minutes without a consistent reading, the system will re-run the initial sun acquisition procedure and continue acquiring optimal orientations.)

Other optimization routines may be used, such as sweeping at a controlled rate along a longer arc on each axis or adjusting the step size as the optimum is sought.

When the center position on the graph is chosen as the maximum, the system will record that it has found the maximum location along this axis the system will switch to the other axis for optimization. The times and locations of axis maxima are recorded for later use by the model-based sun-tracking procedure, as well as the end-of-day and beginning-of-day estimation procedures.

If differential sensors are used to produce the above-described differential signal, they can be used directly to align the system to the sun without requiring either sweeping or the step-based optimization techniques described above. For example, the sun may be acquired and tracked by controlling azimuth and elevation to maintain a zero or near zero differential signal from sensors mounted on opposing ends of each collector array. The tracking may be used to generate a model in the local coordinate system of power unit 100, as described above. Model-based tracking with periodic optimization as described below may then be used to track apparent movement of the sun.

Model-Based Sun-Tracking Procedure

Once the initial sun-tracking procedure has operated for a specified range (perhaps 10 degrees of motion across the sky) (cloud cover will cause variation in how long this takes), the system will switch to a model-based sun-tracking procedure. The model assumes only that the sun takes a circular trajectory around an axis of rotation during the day, that the elevation of this circle varies less than ½ degree from day to day, and that the apparent elevation varies due to the effect of the atmosphere in a way that can be modeled accurately enough for our tracking needs). The speed of motion is calculated, and is expected to be near 24 hours for earth-mounted power units 100.

The estimated model parameters are: (1) period of repeat (estimated to compensate for CPU clock-speed inaccuracy and slight variation in day length as the earth orbits the sun), (2) peak power generation (varies based on season and condition of the generator), (3) axis of rotation (polar axis in the local coordinate system of power unit 100), (4) altitude of the orbit with respect to the polar axis, (5) change in altitude per day, and optionally (6) sunrise (defined as power crossing 15% of peak), and (7) sunset (defined as power crossing 15% of peak). The change in apparent elevation is expected to be modeled as a fixed function independent of pier-orientation estimate, but could be modeled if needed.

One method of estimating these parameters is as follows: The path of the sun is estimated by fitting a plane to the points swept out by the end of a unit Z axis rotated to point towards the sun at each measurement orientation; the normal to this plane is the polar axis. The average angle between these points and the polar axis provides an estimate of the altitude of the rotation. The angle and time of the initial and final measurements provide estimates for the initial position and speed of rotation. (Other estimation procedures may be used, including the fitting of a constant offset and speed to the various orientation points.) The change in altitude between days is to be estimated each day by subtracting the average altitude for the previous two days. Sunrise and sunset are estimated using the procedure described below. Peak power generation is estimated using the procedure described below.

During model-based tracking, the estimated trajectory of the sun acquired the previous day will be used to drive the system in an open-loop procedure (the stepper motors are used to provide closed-loop motion in azimuth/elevation space, but the sun is tracked open loop). During this time, the two-axis optimization routine described under the initial sun-tracking procedure is to be run less frequently (perhaps once every 15 minutes), as opposed to continuously as was done during initial tracking. The optimal orientations are stored, along with the times at which they occur. If no optimum is found within one minute, the system will go back to open-loop tracking and record a failure to optimize; such failures are not used in the curve fitting.

At the end of the day, these optimal orientations will be used to fit a new curve, which will be used to estimate the inter-day altitude change of the sun and to drive the model the following day. (Optionally, the curve may be updated based on each new measurement; taking into account either all measurements to date or a subset of the measurements that will enable the system to work in the presence of clock drift and changes in pier orientation or power unit configuration.)

If insufficient optimum points are found (perhaps fewer than 20) to fit the curve for five days in a row, or if a power unit does not find the sun when the other inputs reports that it should have, the power unit will re-run the cold-boot procedure.

Power Unit Warm Boot Procedure

Once power unit 100 has an estimated sun path, it will proceed open loop to the expected sun location and then run its optimization routine to determine the actual sun location. It re-optimizes and updates its estimate while tracking as described above.

Thus, the tracking algorithm according to the present implementation allows the sun to be accurately located and tracked using the orientation of the array in its local coordinate system and output power measurements or other estimates of optimal orientation. Because the tracking algorithm is developed automatically, arrays can be set up in different locations and/or move without requiring skilled technicians to recalibrate the arrays.

Optical Sensors

Figure 6:
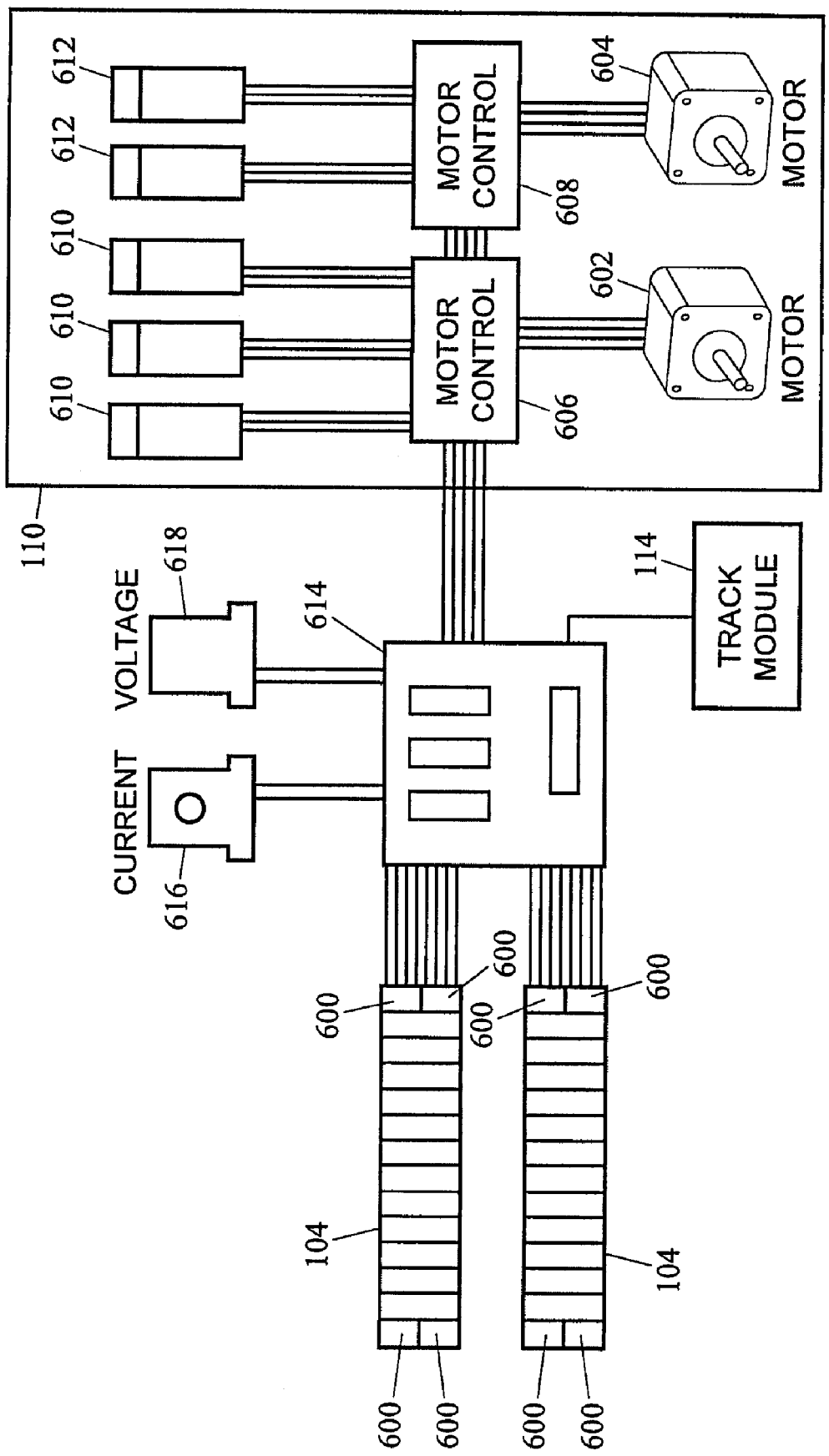
FIG. 6 is a schematic diagram of a photovoltaic collection system and orientation control components according to an embodiment of the subject matter described herein.

As indicated above, feedback for tracking module 114 may be provided based on power output from the same cells of power unit 100 that produce output power or using separate sensors. FIG. 6 is a schematic diagram illustrating the use and placement of incident light sensors to provide feedback to tracking module 114. Referring to FIG. 6, arrays 104 include pairs of optical sensors 600 located on opposing ends of arrays 104, with one sensor being located in each corner of each array 104. Sensors 600 may be solar cells that produce current in proportion to incident light. In an alternate implementation, sensors 600 may be photoresistors that change resistance in proportion to incident light. Also illustrated in FIG. 6 are components of drive unit 110. The components include elevation motor 602, azimuth motor 604, elevation motor control 606, azimuth motor control 608, elevation limit switches 610, and azimuth limit switches 612. As indicated above, limit switches 610 and 612 may be used to determine the elevational and azimuthal orientation of power unit 100 in pier-centric coordinate system.

The system illustrated in FIG. 6 also includes current and voltage transducers 616 and 618 that measure current and voltage output of power unit 100. Embedded controller 614 includes tracking module 114, which automatically derives the tracking algorithm and tracks the apparent movement of the sun using the automatically derived tracking algorithm.

In one implementation, a power unit 100 will consist of a set of collectors that are aimed by a pair of Anaheim Automation's (www.anaheimautomation.com) 23MDSI106S model stepping motors controlled by a local, dedicated Technologic System's (www.embeddedarm.com) TS-7250 200 Mhz ARM CPU tracking computer running embedded Linux. This computer will send commands to the two motors using an RS-485 bus and receive reports from them over this same bus. Each motor is a stepper motor to be connected to two limit switches (one at each end of its range of travel). The computer will receive (via a second serial communications connection) power-level reports from a Maximum-Power-Point Tracker (MPPT) unit or current+voltage measurement unit attached the output of the receivers. Each power unit may have a serial or Ethernet connection to an EKA radio transmitter (www.ekasystems.com) that communicates with its control cluster master. The computer, EKA radio, and power-point tracking electronics are to be packaged within NEMA-standard enclosures.

In the example illustrated in FIG. 6, sensors 600 are located on two photovoltaic arrays 104. Including feedback sensors on two arrays of a plural array power unit, such as that illustrated in FIG. 1, may be advantageous for redundancy. For example, in the power unit illustrated in FIG. 1, sensors 600 may be included on arrays 104 located in opposite corners of power unit 100. In an alternate implementation, sensors 600 may be included on a single array 104 of power unit 100. In such an implementation, it may be desirable to include sensors 600 on an array 104 that is near the center of power unit 100.

In the example illustrated in FIG. 6, a set of four sensors 600 is placed at the corners of each collector array 104. Each collector array 104 is a linear array of solar cells that can be manufactured by placing (manually or robotically) solar cells onto a circuit fabricated on a metal backplane and passing the assembly through a reflow oven. In use, these cells are illuminated with a rectangular image of the sun produced by a trough shaped reflector as described above with respect to FIG. 1. To implement an autoguiding system, four smaller sensors 600 are placed on the circuit card that forms a collector array 104. Sensors 600 can be scraps or cutoffs produced when power generation solar cells in each array 104 are cut from their parent wafers. Sensors 600 are also attached during the reflow process. Their electrical connections are carried separately to load resistors on the same circuit card and when illuminated they produce voltages proportional to the amount of illumination. They are located in such a way that balancing the voltages on the sensors 600 keeps the linear image of the sun optimally aligned to the energy-producing string of cells. Additionally, summing the voltages provides an independent measurement of the solar output suitable for detecting clouds, dust, or other solar extinction phenomena.

The second component useful in a reflective, concentrating power unit according to an embodiment of the subject matter described herein is an oversized reflector; i.e., a reflector that is greater in lateral dimension than a sensor array 104. This makes the linear image of the sun produced on each array 104 longer than the string of power producing cells, allowing simultaneous illumination of all four sensors 600. If the edge of the reflector is a sharp boundary, the resulting system will produce sensor cell voltages that drop abruptly when misalignments cause the image to move off any pair of sensor cells. By measuring which pair of cells has a lower voltage, the solar tracking software can determine the direction of the pointing correction required. However, for voltages that change very abruptly, the software will not be able to determine the size of the pointing correction to apply.

Although in the example illustrated in FIG. 6, two sensors 600 are located on opposite ends of each of two arrays 104, the subject matter described herein is not limited to this placement. For a multi-array power unit, such as that illustrated in FIG. 1, sensors 600 for elevational tracking of the sun can be located within the focus of the mirrors at any location on opposing sides of the beam of light product by reflectors 106. For example, two sensors 600 for elevational sun tracking can be elevationally separated from each other on opposite sides of the line of arrays 104. Sensors 600 for azimuthal sun tracking can be azimuthally separated from each other on opposite ends of the line of arrays 104. In a minimum configuration, two sensors 600 elevationally separated from each other can be located on one end of the line of arrays 104 and one sensor 600 can be located on the opposite end of the line of arrays 104. The combination of three sensors in the minimum configuration can be used for azimuthal and elevational sun tracking.

Apodization Pattern

To reduce the rate at which the voltage changes for a fixed pointing error, apodization can be applied to the edge of the reflector which causes the image brightness to drop slowly in a way that depends upon the apodization pattern. This pattern is confined to short enough regions at the reflector edge that power production is not reduced.

The apodization can be effected by taping the edge of the reflector with opaque tedlar tape that has been cut with a pattern. Tedlar tape or other edge treatment is a necessary element of our reflectors to prevent moisture from entering the edge of the reflective surface and oxidizing the metallized layer, so apodization is accomplished via this method with minimal added cost.

Figure 7:
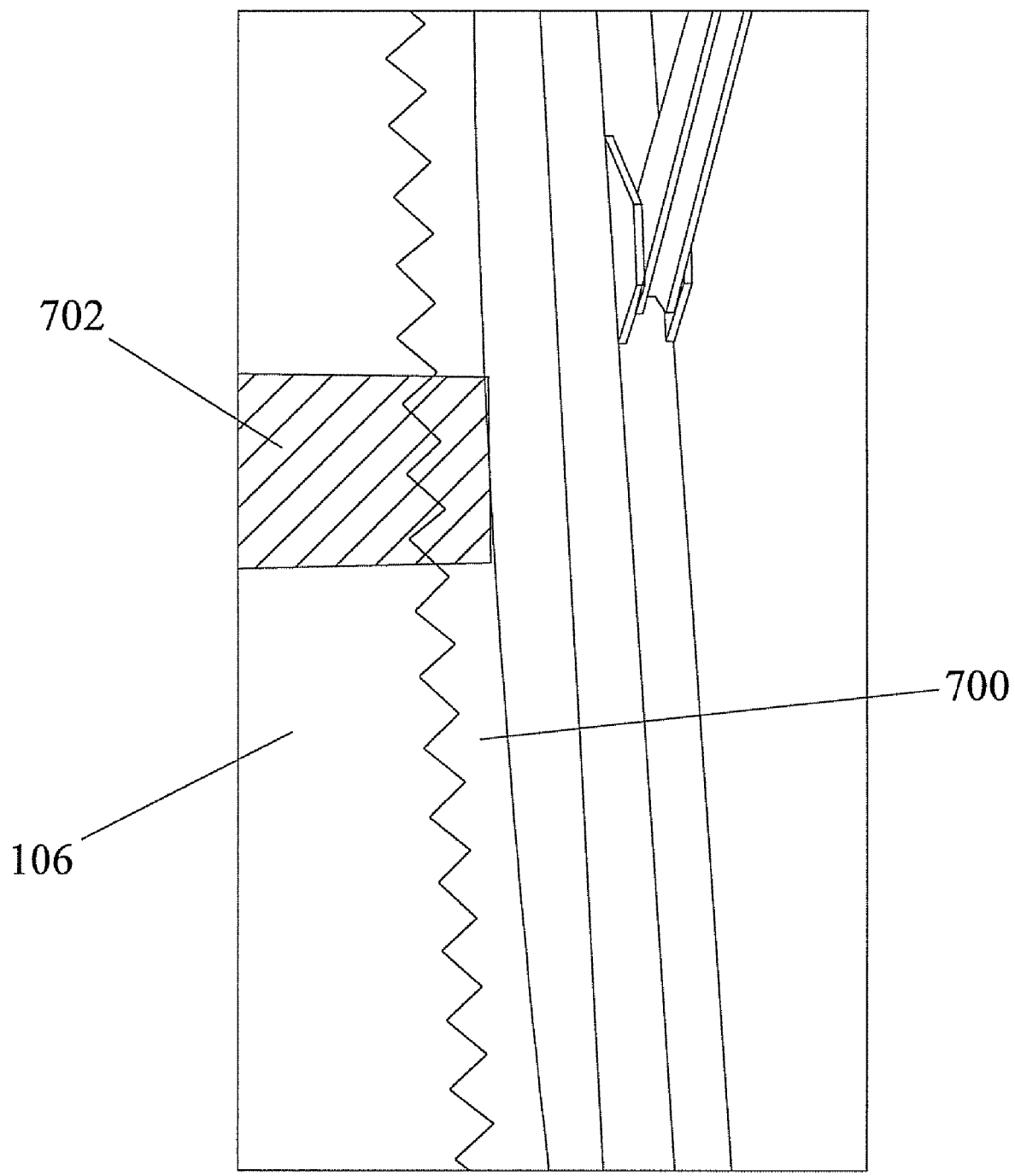
FIG. 7 is a top view of a reflector having an apodization pattern on an edge of the reflector according to an embodiment of the subject matter described herein.

In the short dimension of the rectangular image of the sun produced by reflectors 106, no additional reflector treatment is required because the image produced by reflectors 106 is not sharp. Thus, one enhancement associated with reflectors 106 is to provide non-reflective patterns on the longer sides of reflectors 106 to reduce the rate of change in the current output of sensors 600 as the image of the sun appears across a pair of sensors 600 and off of the pair of sensors 600. For example, without any modification, reflectors 106 have straight edges. The resulting image of the sun will also have a straight edge, resulting in a high rate of change in output of a pair of sensors 600 as the image of the sun moves across a sensor pair. In order to reduce this rate of change so that the control system implemented by tracking module 114 can respond appropriately, it may be desirable to include an apodization or smoothing pattern on the longer lateral edges of each reflector 106. In one embodiment, as illustrated in FIG. 7, a serrated or saw-tooth pattern 700 is produced on opposite edges of a reflector 106. Although not illustrated in FIG. 7, it is understood that serrated pattern 700 would appear on both the longer lateral edges of reflector 106.

Figure 8:
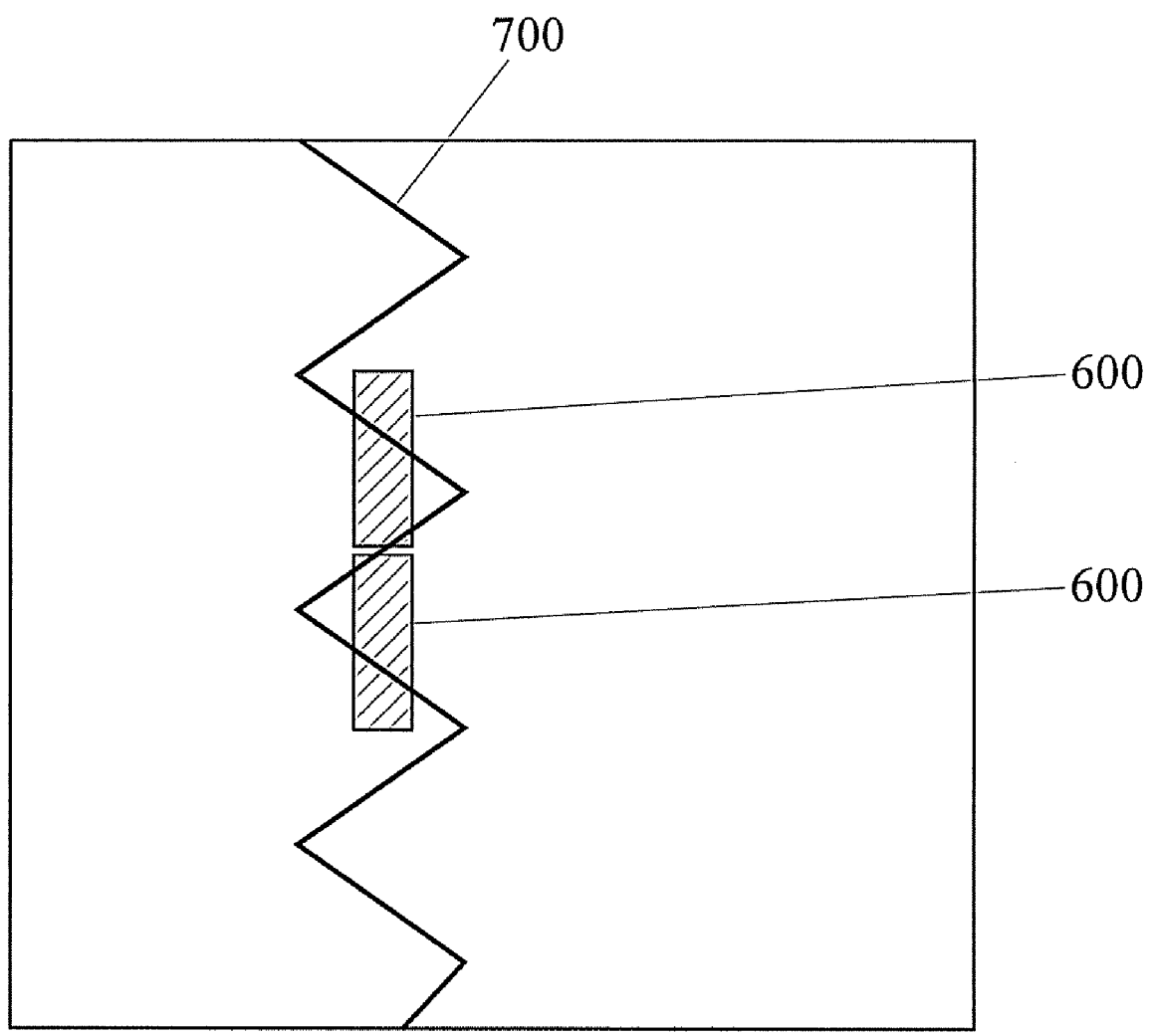
FIG. 8 is a schematic diagram illustrating a portion of the image of the sun produced on a sensor pair by the apodization pattern of FIG. 7.

FIG. 8 illustrates how pattern 700 should be aligned with sensors 600 to produce a signal that is ½ of the maximum output of sensors 600 when the power unit is correctly aimed. In operation, pattern 700 will represent the image of the sun across the associated reflector, although the image will be blurred due to the shape of the mirror. As the sun moves, pattern 700 moves with respect to sensors 600. The resulting rate of change in current output by each sensor 600 is lower than that produced by a straight reflector edge. As a result, the control system implemented by tracking module 114 can respond more appropriately.

Reflector-Edge Tape Analysis

This section presents an evaluation of the effects of adding apodization tape to the reflector edges. It attempts to determine the optimal spacing for the tape, towards the following goals:

Widening and linearizing the zone where light falls off next to the incident-light sensors, and Avoiding reduction of the light reflected onto the power-producing cells.

Basic Procedure

All tests were implemented using a 4-reflector power unit. The tests were performed on two reflectors that have a focal length of about (47.045"). In the tests, the two reflectors were on the same side of the power unit, one below and one above the other.

Two 2¾" by 48" pieces of dibond were cut and lines were drawn with about a 16th tolerance with respect to the outside edge of the cell row with a spacing of 45⅛" from center to center on the line and a second set of lines were drawn to represent the inside edge line of the incident light sensor at a spacing of 46⅝" from center to on those lines. The tolerance of these targets is as accurate as possible given float in reflow of both cells and sensors.

As seen in FIGS. 9-12, three black lines were drawn on each end of the receiver, each at a measured distance from this center:

Outermost edge of the last power-receiving cell 22 9/16" from the center,

Innermost edge of light-sensitive region of the incident-light sensors 23 5/16", Outermost edge of the light-sensitive region of the incident-light sensors, 23 9/16".

Placement of these targets was by hand approximately centered in the receiver trays. The sun was then centered on the receiver by eye and verified by analysis of the signal and both ends of a reflector. The targets were backed off in depth ¼" to match the focal location of the sensors. Two smaller white reflectors were added to the outside edges of each of these to collect light spilling past the ends of the targets.

The testing studied two cases: (1) a solid tape edge at ½" from the reflector edge and (2) a ¾" serration starting ¼" from the reflector edge (total tape width of 1").

Case 1: Flat Tape on the Reflector Edge

Figure 9:
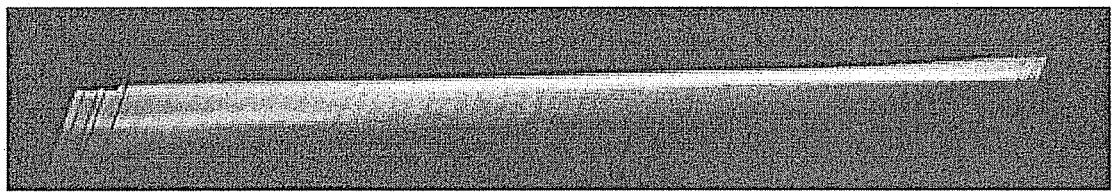
FIG. 9 is an image illustrating the reflection of the sun on a receiver when the corresponding reflector includes flat-edged tape.

FIG. 9 shows the entirety of the lower receiver with flat-edged tape when the reflector was placed in its test position in the sun.

This study was done with a band of tape overlapping the last ½" of the reflector. The reflector was again aligned by eye to place the beam in the center of the receiver, with the tape shadow falling halfway to either side of the line indicating the receiver center.

Figure 10:
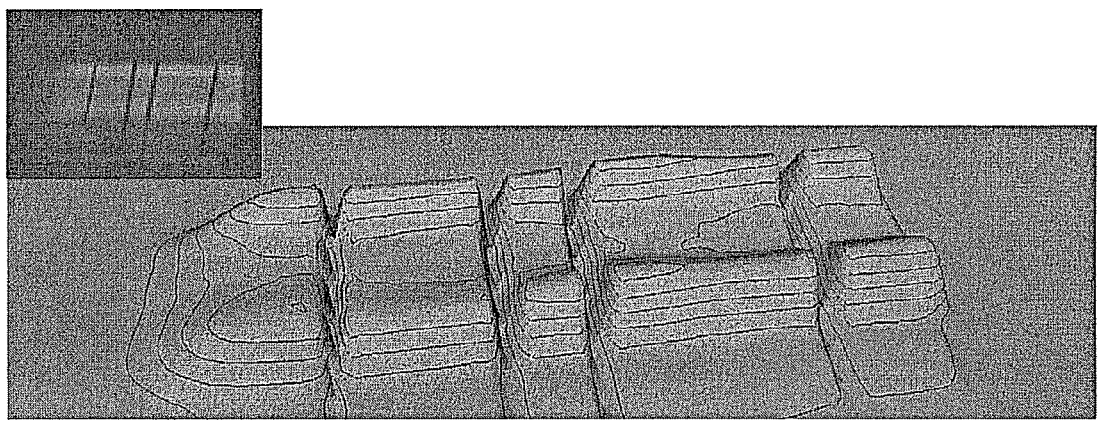
FIG. 10 is a close-up view of the resulting light pattern on the left side of a reflector and a light intensity map where light intensity corresponds to height for a flat-edged apodization tape experiment.

A close-up view of the resulting light pattern on the left part of the reflector is shown on the left hand side of FIG. 10. A visualization of a brightness-reduced version of this image that maps intensity to height is shown in the remainder of FIG. 10. The dark gaps through the surface are the black lines. The evenly-spaced isovalue contour lines indicate that the tops of the two irregularly-spaced peaks near the left edge of the double-lobed band are approximately the same maximum brightness, but the far band is about 20% brighter at its peak than the near band.

Figure 11:
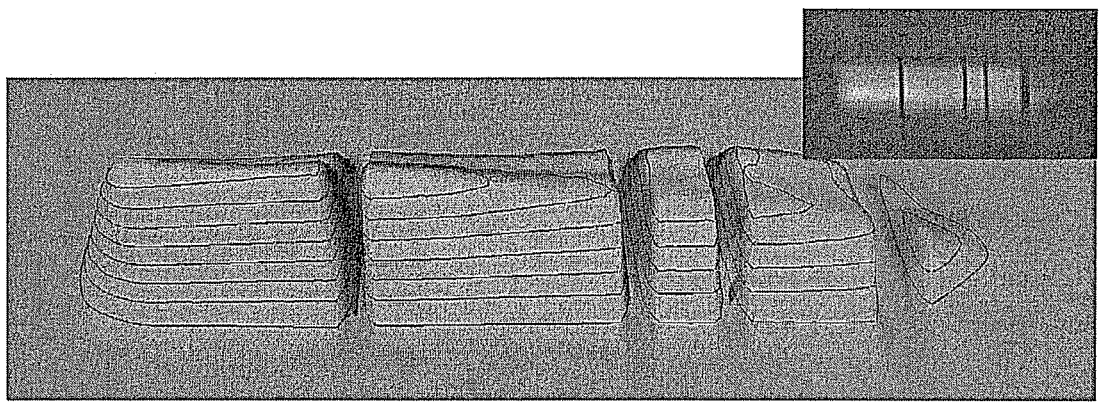
FIG. 11 is an image of incident light on the right side of the reflector and a corresponding light intensity map for the right side of the reflector for the flat-edged apodization tape experiment.

A close-up view of the light pattern on the right part of the reflector is shown on the right hand side of FIG. 11. A visualization of a brightness-reduced version of this image that maps intensity to height is shown in the remainder of FIG. 11.

Discussion: The beam is much wider than the incident-light sensors, as expected.

Case 2: Serrated Tape on the Reflector Edge

This study was done with a serrated band of tape going from ¼" to 1" from each edge of the reflector. The reflector was again aligned by eye to place the beam in the center of the receiver. Only one reflector was outfitted with this tape (the lower reflector).

Figure 12:
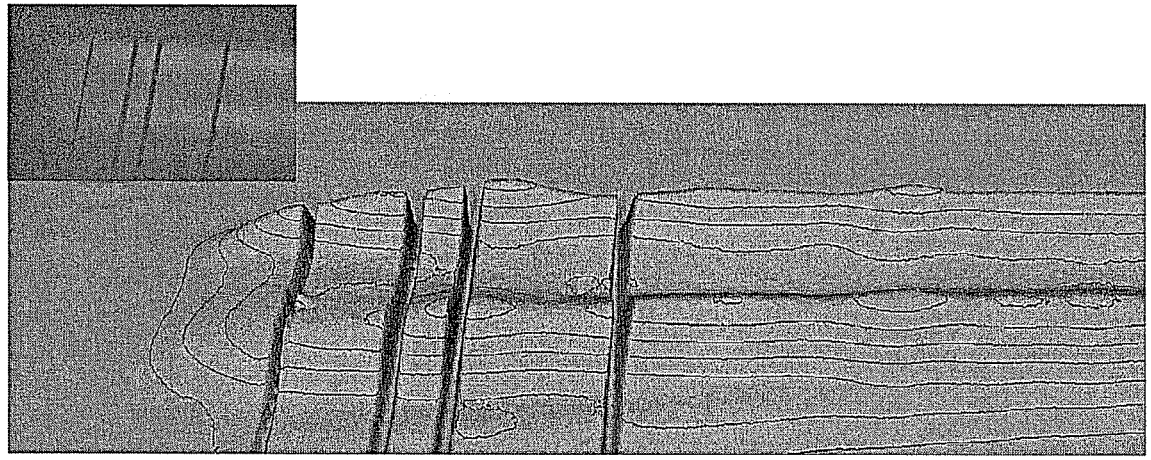
FIG. 12 is a view of light intensity and a corresponding light intensity map for the left side of the reflector for a serrated edge apodization tape experiment.

A close-up view of the resulting light pattern on the left end of the receiver is shown on the left hand side of FIG. 12. A visualization of a brightness-reduced version of this image that maps intensity to height is shown in the remainder of FIG. 12. The sloped drop in light levels appears to begin just within the incident-light-sensor.

Figure 13:
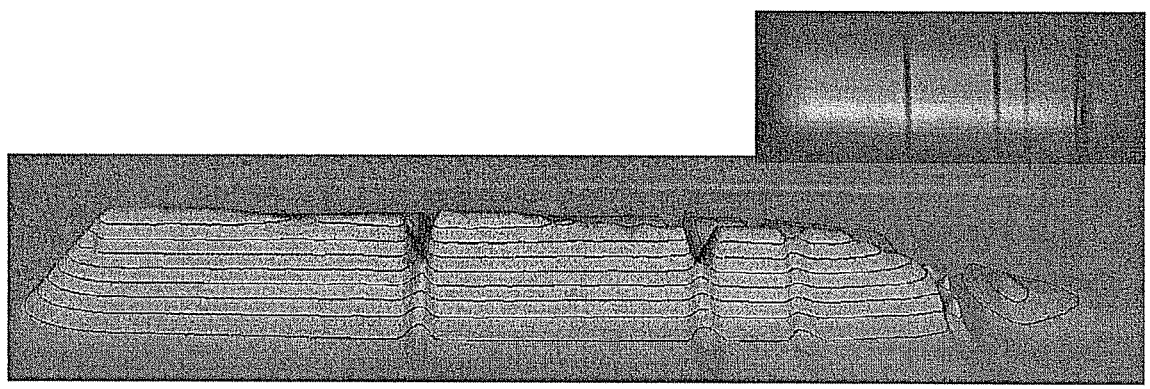
FIG. 13 is a view of light intensity and a corresponding light intensity map for the right side of the reflector for the serrated edge apodization tape experiment according to an embodiment of the subject matter described herein.

A close-up view of the resulting light pattern on the right end of the receiver is shown on the right hand side of FIG. 13. A visualization of a brightness-reduced version of this image that maps intensity to height is shown in the remainder of FIG. 13. The sloped drop in light caused by the serration appears to begin about ¼" to the right of the incident-light sensor.

Discussion: The light band before it begins to fall off on the right end of the receiver appears to be about ¼" to the right of the first useful location (½" to the right of the optimal, which would place the incident-light sensor on the middle of the downward slope); indicating a desire for a narrower band.

The band appears to fall off at the left end about ¼" to the left of the optimal location, again indicating a desire for a narrower band. There is an apparent rise in light levels just to the right of this fall off. This will cause a matching pairs of lower values at the present location and again about ½" to the right of the present location so on a flat signal on the right sensor we would have two local minima to track on that are more than our tolerance apart.

This study indicates that for this reflector, a decrease in width of about ¾" (increase in total tape width) would be optimal for tracking, placing the incident-light sensors about halfway down the slope on each end.

Discussion

An initial study with a different reflector on a jig that had more flexation showed that taping with ½" full coverage followed by ¾" serration produced a light band that was too wide, and that ¼" reduction was called for, which would produce an optimal spacing with ¼" full tape followed by ¾" serration at each edge.

A subsequent study on the 4-reflector gamma unit showed inconclusively that a ¼" gap on each side was insufficient to produce sharp slopes on both light sensors, resulting in a recommendation to make the tape wider.

The present study on a second 4-reflector unit indicates that the optimal total tape width in this reflector would be near 2¾", as compared to the 2" used in the study; making the tape at each edge 1⅜" wide, consisting of a ¾" serration and a ⅝" solid overlap.

To allow for ¼" tolerance in tape placement, and the ½-degree misalignment called for in power unit tolerance (translates to another ¼" offset), we'll need to keep a ½" gap between the beginning of the light reduction and the outer edge of the last power-receiving cell. In each of the two most-recent studies (where both ends of the reflector were observed for the same incident sun), we were far from this limit. In the original study, there was discrepancy between the expected and seen location that can be explained by improper centering of the signal on the receiver.

Summary and Recommendation

The ¾"-serration tape on the reflector edge met both of its goals, but its signal is shifted with respect to its optimal placement. The serrated edge improves the incident-light sensor input without infringing on power production. For incident-light-sensor response, it does the following:
Reduces bright lobes before the final reduction to background levels.
Increases the width of the transition zone from brightest to background level.
Centers the transition zone on the incident-light sensors, providing a sensitive feedback signal without a dead band.
Allows for the specified ¼" tolerance in the tape placement while still doing all of the above.
For power production, it does the following:
Maintains maximum light levels past the edge of the last power cells even when the entire serrated region of the tape is covered.
Provides approximately ½" safety zone on each end of the receiver, which is twice the ¼" tape alignment tolerance. This is equal to the sum of the tape tolerance and the ¼" offset that corresponds to the ½-degree reflector misalignment error for which the power unit was designed. The reduction to background past this point would be modulated by the tape serrations, so would initially be very small and would be full at ¾" past the initial onset.
Based on the foregoing, using ¾" wide serrations with ⅝" overlap is recommended.

Shielding Between Adjacent Sensor Arrays

Figure 14:
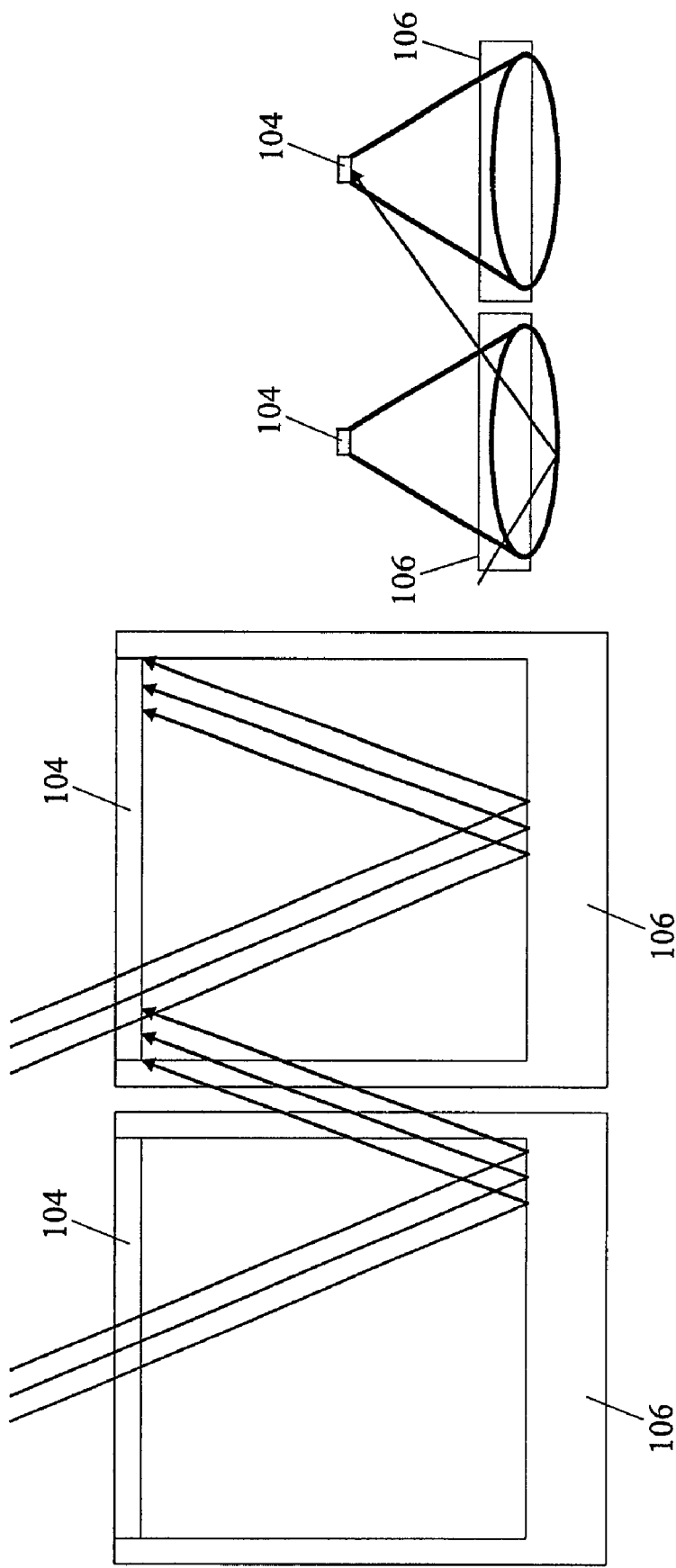
FIG. 14 is an optical schematic diagram illustrating the effects of interference of a reflected light between adjacent photovoltaic arrays according to an embodiment of the subject matter described herein.

According to another aspect of the subject matter described herein, shielding may be included between adjacent sensor arrays to avoid interference from the reflected image of the sun from one reflector producing multiple sun images and thus multiple maxima that may affect the control of power unit 100. FIG. 14 illustrates this concept. In the diagram on the left hand or bottom side of FIG. 14, light rays incident on one reflector 106 may be reflected to a sensor array 104 associated with an adjacent reflector in the lateral direction, where the lateral direction is defined as the direction from a long side of one reflector to the long side of an adjacent reflector. Interference from adjacent arrays in the lateral direction would likely be problematic because the image of the sun reflected from an adjacent reflector in the lateral direction would be concentrated where the image impacts the adjacent array. Since this interference is not desirable, shielding may be used to reduce such interference. Returning to FIG. 2, in one embodiment, the shielding may be placed on opposing ends of each array 104. In FIG. 2, shields 200 extend outward from opposing ends of each array 104 to prevent light rays reflected from adjacent reflectors from impacting respective sensor arrays 104. In the illustrated example, shields 200 are located between adjacent sensor arrays 104 on the long sides of reflectors 106. Including shields 200 on sensor arrays 104 between the long sides of the reflectors 106 prevents the focused image of the sun from adjacent reflectors from interfering with adjacent collector arrays. Shields may also be included on each collector array adjacent to the short sides of reflectors 106. However, because the image of the sun on the short sides of each reflector will be out of focus at the adjacent vertical collector array, such shielding may not be necessary. This phenomenon is illustrated by the diagram on the right hand or top side of FIG. 14. In this diagram, light rays that contact a reflector 106 and that are reflected onto an adjacent reflector 104 in a direction orthogonal to the lateral direction are out of focus at the adjacent reflector 104. Hence, shielding in this direction may not be required.

Pointing Model

According to another aspect of the subject matter described herein, a pointing model may be used with any of the methods described above for controlling the orientation of power unit 100 to track apparent movement of the sun. A pointing model suitable for use with the subject matter described herein may model the offset of pier 102 with respect to another coordinate system, such as a coordinate system centered about the axis of the earth or a coordinate system defined by the output of compass and tilt sensor 112. Such a pointing model may be used to map an ephemeris defined in the other coordinate system to the coordinate system of pier 102 or vice versa.

A pointing model can be developed without using iterative nonlinear optimizers which would be a downside because they are subject to local minima, need derivative info, initial guesses, etc. A two-Euler-angle pole tilt is still very accurate even to 5-10 degrees with a small angle approximation. So are the zero point offsets if you subtract the first estimation. This is how telescope pointing models work and remain numerically stable using linear optimization. Telescope pointing models typically correct mechanical defects to make the approximations even more valid, but they also require arc second precision. A percentage uncertainty in reduction ratio can be added to the model without sacrificing linearity. An advantage of modeling the geometrical system is that model parameters are directly meaningful and useful. It gives immediate feedback on how well piers are placed, aligned, calibrated, etc.

A full solar ephemeris is stable and easily testable/verifiable against other sources. It predicts the exact position (to desired any precision) of the sun for a thousand years. The advantage of this approach is that one day of data tells you exactly how to position power unit 100 until a free parameter, such as pier tilt, direction, sensor position, reduction ratio, etc., changes. It is expected that these parameters will remain constant with time, thus validating the models described herein.

A closed-loop mode is needed to gather the data, but just knowing the az/el offset parameters are sufficient local estimators for local tracking. Once the sun has been located once and azimuth and elevation offsets have been measured ignoring the other parameters still enables prediction of the path accurately enough for a few degrees of solar motion. After gathering just one point, tracking can be done through a cloud for 10 minutes. This removes the need for a large baseline of points to fit a plane; predictive capability comes after a single measurement. These linear Cartesian solutions have been validated using a spherical transform in parallel to produce the offset data points.

The following equations illustrate a method for mapping one coordinate system to another using the pointing model. The method described below can be used to map an ephemeris into the coordinate system of power unit 100 or vice-versa.

Define a coordinate transform C->C' in Cartesian space that consists of a rotation about x (E) of alpha and then a rotation about the subsequent y (N) of beta:

$$R_\alpha = \begin{pmatrix} 1 & 0 & 0 \\ 0 & c_\alpha & s_\alpha \\ 0 & -s_\alpha & c_\alpha \end{pmatrix}$$

$$R_\beta = \begin{pmatrix} c_\beta & 0 & -s_\beta \\ 0 & 1 & 0 \\ s_\beta & 0 & c_\beta \end{pmatrix}$$

$$R = R_\beta R_\alpha = \begin{pmatrix} c_\beta & s_\beta s_\alpha & -s_\beta c_\alpha \\ 0 & c_\alpha & s_\alpha \\ s_\beta & -s_\alpha c_\beta & c_\beta c_\alpha \end{pmatrix}$$

$$R^T = R_\alpha^T R_\beta^T = R_\alpha^{-1} R_\beta^{-1} = R^{-1}$$

$$R^{-1} = \begin{pmatrix} c_\beta & 0 & s_\beta \\ s_\beta s_\alpha & c_\alpha & -s_\alpha c_\beta \\ -s_\beta c_\alpha & s_\alpha & c_\beta c_\alpha \end{pmatrix}$$

To solve for the magnitude and azimuth of the tilt in C, multiply the vector (0, 0, 1) in the C' by R inverse:

$$R^{-1} * \begin{pmatrix} 0 \\ 0 \\ 1 \end{pmatrix} = \begin{pmatrix} s_\beta \\ -s_\alpha c_\beta \\ c_\beta c_\alpha \end{pmatrix}$$

Transforming from Cartesian to spherical gives:

$$\cos(\xi) = \gamma = \sin(\alpha) = z = c_\beta c_\alpha$$

$$\tan(\eta) = \frac{x}{y} = \frac{s_\beta}{-s_\alpha c_\beta}$$

The measured azimuth and elevation are further offset from the C' frame by linear encoder zero points such that:

$$\alpha' = \alpha'' + \alpha_0$$

$$A' = A'' + A_0$$

Individually examine the Cartesian components of the transform defined by R:

$$x' = C_\alpha S_{A'} = c_\beta x + s_\beta s_\alpha y - s_\beta c_\alpha z$$

$$y' = c_\alpha y + s_\alpha z$$

$$z' = s_\beta x - s_\alpha c_\beta y + c_\beta c_\alpha z$$

Expand the primed spherical coordinates using the identities below:

$$\sin(a \pm b) = \sin(a)\cos(b) \pm \cos(A)\sin(b)$$

$$\cos(a \pm b) = \cos(a)\cos(b) \mp \sin(a)\sin(b)$$

For example, x' can be expanded and approximated as follows:

$$x' = C_\alpha' S_{A'} = [C_\alpha'' C_{\alpha_0} - S_\alpha'' S_{\alpha_0}][S_A'' C_{A_0} + C_A'' S_{A_0}] = c_\beta$$
$$(C_A S_\alpha) + s_\beta s_\alpha (C_\alpha C_\alpha) = s_\beta c_\alpha (S_\alpha)$$

Make small angles for sin(x)~x and cos(x)~1, discarding any $2^{nd}$ order terms:

$$C_a'' S_A'' + A_\beta C_A'' C_a'' - a_0 S_A'' S_a'' \cong (C_A S_\alpha) - \beta(S_\alpha)$$

Reordering terms and recognizing x and x'':

$$x'' = x \cong -A_0 C_A'' C_a'' + a_0 S_A'' S_a'' = \beta(S_\alpha)$$

The same process yields small angle approximations for y" and z":

$$y' = [C_a'' C_{a_0} = S_a'' S_{a_0}][C_A'' C_{A_0} = S_A'' S_{A_0}] = c_\alpha(C_A C_\alpha) + s_\alpha$$
$$(S_\alpha)$$

$$y'' - y \cong \alpha S_\alpha + A_0 S_A'' C_a'' + a_0 C_A'' S_2''$$

$$z' = [S_{a''} C_{a_0} + C_{a'''} S_{a_0}] = s_\beta(C_\alpha S_A) - s_\alpha c_\beta(C_\alpha C_A) + c_\beta c_\alpha(S_\alpha)$$

$$z'' = z \cong -\alpha_0 C_{a''} + \beta C_\alpha S_A - \alpha C_A C_A$$

These three approximations can be expressed in matrix notation as:

$$\begin{pmatrix} \Delta x \\ \Delta y \\ \Delta z \end{pmatrix} \cong \begin{pmatrix} 0 & -S_\alpha & -C_A'' C_a'' & S_A'' S_a'' \\ S_\alpha & 0 & S_A'' C_a'' & C_A'' S_a'' \\ -C_A C_\alpha & S_A C_\alpha & 0 & -C_a'' \end{pmatrix} \begin{pmatrix} \alpha \\ \beta \\ A_0 \\ \alpha_0 \end{pmatrix}$$

$$e = M\alpha$$

Every measurement of (A", a") will correspond to an ephemeris derived pair (A,a) using time and location information. The free parameters can be solved for using simultaneous linear-least squares:

$$Y = X\alpha$$

$$\text{Where } X = \begin{pmatrix} M_1 \\ M_2 \\ \ldots \\ M_n \end{pmatrix}$$

$$\text{and } Y = \begin{pmatrix} e_1 \\ e_2 \\ \ldots \\ e_n \end{pmatrix}$$

The matrix entries above denote full matrices corresponding to the $i^{th}$ pair of alt-az measurements. If N measurements are taken, X will be of size (3*N) by 4 and Y will be of size (3*N) by 1.

The best fit coefficient vector can be found in typical fashion for linear-least squares:

$$\alpha = (X^T X)^{-1} X^T Y$$

Small angle approximation for the orthogonal rotations is good to the required pointing accuracy for as much as 5-10 degree tilt magnitude. The small-angle approximations for the zero-point offsets can be made arbitrarily accurate by iteratively applying the following technique:

1. Find solution vector using technique above.
2. If offsets are large, save them and precondition input data to remove offsets.
3. Repeat until offsets are sufficiently small.
4. Calculate net offsets by adding all saved offsets from iterative, linear fits.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for controlling orientation of a photovoltaic collection system to track apparent movement of the sun using a photovoltaic-collection-system-derived tracking algorithm, the method comprising:
   determining an initial orientation of a photovoltaic collection system;
   automatically deriving, using output from the photovoltaic collection system as it tracks apparent movement of the sun across the sky caused by the spinning of the earth on its axis and its orbit around the sun, a tracking algorithm for controlling orientation of the photovoltaic collection system to track the apparent movement of the sun, wherein automatically deriving the tracking algorithm includes estimating a trajectory of the sun during a first day; and
   controlling orientation of the photovoltaic collection system to track the apparent movement of the sun using the photovoltaic-collection-system-derived tracking algorithm, wherein controlling the orientation of the photovoltaic collection system includes using the estimated trajectory to drive the photovoltaic collection system during a second day after the first day.

2. The method of claim 1 wherein the photovoltaic collection system includes a plurality of reflectors and a photovoltaic array positioned opposite the reflectors wherein the reflectors generate a blurred image of the sun on the surface of the photovoltaic array.

3. The method of claim 2 wherein the photovoltaic collection system includes a pier for supporting the reflectors and the photovoltaic array and a motor for controlling azimuth and elevation of the reflectors and the array with respect to the pier.

4. A method for controlling orientation of a photovoltaic collection system to track apparent movement of the sun using a photovoltaic-collection-system-derived tracking algorithm, the method comprising:
   determining an initial orientation of a photovoltaic collection system;
   automatically deriving, using output from the photovoltaic collection system as it tracks apparent movement of the sun across the sky caused by the spinning of the earth on its axis and its orbit around the sun, a tracking algorithm for controlling orientation of the photovoltaic collection system to track the apparent movement of the sun; and
   controlling orientation of the photovoltaic collection system to track the apparent movement of the sun using the photovoltaic-collection-system-derived tracking algorithm;
   wherein automatically deriving the tracking algorithm comprises:
   scanning the sky using photovoltaic collectors of the photovoltaic collection system used to generate output power of the photovoltaic collection system during operation of the photovoltaic collection system and determining an initial location of the sun based on the output power;
   tracking the apparent movement of the sun from the initial location for a first time period using the photovoltaic collection system using feedback based on the output power; and
   generating, based on the tracking, an open loop tracking algorithm for tracking the sun.

5. The method of claim 4 wherein controlling movement of the photovoltaic system includes controlling movement of the photovoltaic collection system using the open loop tracking algorithm.

6. The method of claim 4 for controlling orientation of a photovoltaic collection system to track apparent movement of the sun using a photovoltaic-collection-system-derived tracking algorithm wherein scanning the sky includes scanning the sky in a Lissajous pattern.

7. The method of claim 4 wherein tracking the apparent movement of the sun includes tracking movement without using a sensor separate from the photovoltaic collection system.

8. The method of claim 4 wherein generating an open loop orientation control algorithm includes determining a location of the sun and the corresponding time using a timer.

9. A method for controlling orientation of a photovoltaic collection system to track apparent movement of the sun using a photovoltaic-collection-system-derived tracking algorithm, the method comprising:
   determining an initial orientation of a photovoltaic collection system;
   automatically deriving, using output from the photovoltaic collection system as it tracks apparent movement of the sun across the sky caused by the spinning of the earth on its axis and its orbit around the sun, a tracking algorithm for controlling orientation of the photovoltaic collection system to track the apparent movement of the sun; and
   controlling orientation of the photovoltaic collection system to track the apparent movement of the sun using the photovoltaic-collection-system-derived tracking algorithm;
   wherein automatically deriving the tracking algorithm comprises:
   scanning the sky using photovoltaic collectors separate from the photovoltaic collectors of the photovoltaic collection system used to generate output power during operation of the photovoltaic collection system and determining an initial location of the sun based on signals generated by the separate photovoltaic collectors;
   tracking the apparent movement of the sun from the initial location for a first time period using the photovoltaic collection system using feedback based on the signals generated by the separate photovoltaic collectors; and
   generating, based on the tracking, an open loop orientation control algorithm for tracking the sun.

10. A method of claim 1 for controlling orientation of a photovoltaic collection system to track apparent movement of the sun using a photovoltaic-collection-system-derived tracking algorithm, the method comprising:
    determining an initial orientation of a photovoltaic collection system;
    automatically deriving, using output from the photovoltaic collection system as it tracks apparent movement of the sun across the sky caused by the spinning of the earth on its axis and its orbit around the sun, a tracking algorithm for controlling orientation of the photovoltaic collection system to track the apparent movement of the sun;

controlling orientation of the photovoltaic collection system to track the apparent movement of the sun using the photovoltaic-collection-system-derived tracking algorithm; and wherein controlling movement of the photovoltaic collection system using the automatically derived tracking algorithm includes controlling movement of the photovoltaic collection system using the automatically derived tracking algorithm for a time period and repeating the automatic derivation step to derive a new tracking algorithm and controlling movement of the photovoltaic collection system using the newly derived tracking algorithm.

11. A method for controlling orientation of a photovoltaic collection system to track apparent movement of the sun using a photovoltaic-collection-system-derived tracking algorithm, the method comprising:

determining an initial orientation of a photovoltaic collection system;

automatically deriving, using output from the photovoltaic collection system as it tracks apparent movement of the sun across the sky caused by the spinning of the earth on its axis and its orbit around the sun, a tracking algorithm for controlling orientation of the photovoltaic collection system to track the apparent movement of the sun;

controlling orientation of the photovoltaic collection system to track the apparent movement of the sun using the photovoltaic-collection-system-derived tracking algorithm;

wherein the photovoltaic collection system includes a plurality of reflectors and a photovoltaic array positioned opposite the reflectors wherein the reflectors generate a blurred image of the sun on the surface of the photovoltaic array;

wherein the photovoltaic collection system includes a pier for supporting the reflectors and the photovoltaic array and a motor for controlling azimuth and elevation of the reflectors and the array with respect to the pier; and wherein determining the initial orientation of the photovoltaic collection system includes determining an initial azimuth and elevation of the reflectors in a coordinate system centered about the pier.

12. The method of claim 11 wherein determining the initial azimuth and elevation of the reflectors includes using sensors to determine the azimuth and elevation.

13. The method of claim 11 wherein determining the initial azimuth and elevation of the reflectors includes using a hysteresis procedure.

14. A system for controlling orientation of a photovoltaic collection system to track apparent movement of the sun using a photovoltaic-collection system-derived tracking algorithm, the system comprising:

a power unit including at least one photovoltaic array mounted on a pier;

a drive mechanism for controlling orientation of the power unit;

a tracking module for automatically deriving, based on at least one signal output by at least a portion of the power unit, a tracking algorithm for controlling orientation of the power unit to track apparent movement of the sun across the sky caused by the spinning of the earth on its axis and its orbit around the sun and for controlling the drive mechanism to vary orientation of the power unit to track the apparent movement of the sun using the photovoltaic-collection-system-derived tracking algorithm; and wherein the tracking algorithm estimates the trajectory of the sun during a first day and wherein the drive system uses the estimated trajectory determined during the first day to drive the at least one photovoltaic array during a second day after the first day.

15. The system of claim 14 wherein the at least one signal comprises a signal output by collectors in the at least one array used to produce power during operation of the at least one array.

16. The system of claim 14 wherein the at least one signal comprises at least one pair of signals generated by collectors mounted on opposite ends of the at least one array and that are separate from collectors in the at least one array used to produce power during operation of the array.

17. The system of claim 16 wherein the tracking module utilizes a differential signal generated based on the at least one pair of signals to automatically derive the tracking algorithm.

18. The system of claim 14 wherein the power unit includes a plurality of reflectors photovoltaic array pairs and shielding to reduce interference between adjacent reflector-photovoltaic array pairs.

19. A non-transitory computer readable medium having stored thereon computer executable instructions that when executed by the processor of a computer perform steps comprising:

determining an initial orientation of a photovoltaic collection system;

automatically deriving, using output from the photovoltaic collection system as it tracks apparent movement of the sun across the sky caused by the spinning of the earth on its axis and its orbit around the sun, a tracking algorithm for controlling orientation of the photovoltaic collection system to track the apparent movement of the sun, wherein automatically deriving tracking algorithm includes estimating a trajectory of the sun during a first day; and controlling orientation of the photovoltaic collection system to track the apparent movement of the sun using the photovoltaic-collection-system-derived tracking algorithm, wherein controlling the orientation of the photovoltaic collection system includes using the estimated trajectory to drive the photovoltaic collection system during a second day after the first day.

* * * * *